(12) United States Patent
Gaboriau et al.

(10) Patent No.: US 7,327,296 B1
(45) Date of Patent: Feb. 5, 2008

(54) SIGNAL PROCESSING SYSTEM WITH MODIFIED DELTA SIGMA MODULATOR QUANTIZER OUTPUT SIGNALS TO SPREAD HARMONIC FREQUENCIES OF PULSE WIDTH MODULATOR OUTPUT SIGNALS

(75) Inventors: Johann Gaboriau, Austin, TX (US); John L. Melanson, Austin, TX (US); Brian D. Trotter, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/534,417

(22) Filed: Sep. 22, 2006

Related U.S. Application Data

(60) Provisional application No. 60/778,712, filed on Mar. 3, 2006.

(51) Int. Cl.
*H03M 3/00* (2006.01)
(52) U.S. Cl. ........................ 341/143; 341/170
(58) Field of Classification Search ......... 341/143–170
See application file for complete search history.

(56) References Cited

U.S. PATENT DOCUMENTS

| | | | |
|---|---|---|---|
| 5,548,286 A | 8/1996 | Craven | 341/126 |
| 5,784,017 A | 7/1998 | Craven | 341/126 |
| 5,815,102 A | 9/1998 | Melanson | 341/143 |
| 6,150,969 A | 11/2000 | Melanson | 341/143 |
| 6,449,569 B1 * | 9/2002 | Melanson | 341/143 |
| 6,480,129 B1 | 11/2002 | Melanson | 341/143 |
| 6,727,832 B1 * | 4/2004 | Melanson | 341/143 |
| 6,885,330 B2 * | 4/2005 | Trotter et al. | 341/145 |
| 6,965,335 B1 * | 11/2005 | Trotter et al. | 341/143 |
| 6,967,607 B2 * | 11/2005 | Melanson | 341/143 |
| 7,209,064 B1 * | 4/2007 | Gaboriau et al. | 341/152 |

FOREIGN PATENT DOCUMENTS

WO     WO 97/37433     10/1997

OTHER PUBLICATIONS

J. Gaboriau et al., U.S. Appl. No. 10/767,906, filed Jan. 29, 2004, entitled "Circuits and Methods for Reducing Noise and Distortion in Pulse Width Modulation Systems,".

* cited by examiner

*Primary Examiner*—Lam T. Mai
(74) *Attorney, Agent, or Firm*—Hamilton & Terrile, LLP; Kent B. Chambers

(57) ABSTRACT

The signal processing system includes a pulse width modulator (PWM) that receives input signals from a delta sigma modulator. The PWM generates an output signal having successive frames of PWM patterns. Modifying loop filter data, such as a loop filter output signal, of the delta sigma modulator modifies a delta-sigma modulator quantizer output signal, which in turn changes the frame-to-frame duty cycles of the pulse width modulator output. PWM patterns corresponding to substantially similar delta sigma modulator input signal levels have substantially identical pulse widths. The signal processing system shifts rising and falling edges of pulse width modulator output signals relative to pulse width modulated signals generated from unmodified signals by a quanta of time greater than any deviation between the pulse widths. The signal processing system shifts pulse edges of PWM patterns to spread the spectrum of intra-channel and inter-channel harmonic frequencies.

56 Claims, 19 Drawing Sheets

```
function [data_out,cem_out] = cem_with_filtered_noise(A,B,C,D,a,corr_plus,corr_minus,input_a
mp,input_freq,fs,samplehold,qlevels,logpts);
%% [data_out] = dsm_loop(order,a,g,b,c,input_amp,input_freq,fs,samplehold,logpts);
%%
%%  Simulates a delta-sigma loop of given order, using supplied
%% coefficients
%% Currently this only implements feedback designs
%%     A,B,C,D -- state-space description of the modulator
%%     a       -- feedback coefficients of modulator
%%   corr_plus -- correction terms for cem_plus CEM stream
%%   corr_minus -- correction terms for cem_minus CEM stream
%% input_amp -- amplitude of input sine wave, from 0.0 to 1.0
%% input_freq -- frequency of input sine wave
%%     fs -- sample rate of data input to the modulator
%%   samplehold -- sample-and-hold ratio applied to the input data
%%   qlevels -- quantizer qlevels
%%    logpts -- number of points to simulate, as logbase2 (ie, 10
%%              will simulate 2^10 points
%%
%% This implementation adds filtered noise at the quantizer which is
%% modulated up to fs/2. This noise moves the edge locations of the
%% resulting CEM output to reduce the power in higher-order harmonics
%% of the CEM rate, while preserving in-band performance.

%% Determine the order of the modulator
order=length(A);

%% Quantizer max value
qmax=(qlevels-1)./2;

%% create the CEM pulses -- we use the ternary CEM encoder. We only
%% output one stream, but switch back and forth in time from the plus
%% stream to the minus stream
[cem_plus,cem_minus]=ternary_cem_encoder([-(qlevels-1)./2:1:(qlevels-1)./2],qlevels);

%% Check for a valid samplehold value
if (mod(log2(samplehold),1)~=0)
  printf('samplehold must be a power of 2\n');
else
  logsh=log2(samplehold);
end %% sine wave input
input_sine=input_amp.*sin(2*pi*(input_freq./fs).*[0:(2^(logpts-logsh))-1]);

%% Initialize variables
int=zeros(order,2^logpts);
data_out=zeros(1,2^logpts);

%% Log the rising and falling edges separately
cem_rising=zeros(1,(2^(logpts-1)).*qmax);
cem_falling=zeros(1,(2^(logpts-1)).*qmax);
cem_out=zeros(1,(2^logpts).*qmax);

%% intialize the X terms
X=zeros(order,1);

%% Log the max values of all the state variables
int_max=zeros(order,1);

%% keep track of whether you're using cem_plus or cem_minus
use_plus=1;
use_minus=0;

%% initialize an fs/2 signal for use in the EMI reduction
```

FIGURE 9

```
fsbytwo=1;

%% Create a low pass filter
[Blpf,Alpf]=butter(1,(1e3./(fs/2)));

%% set the amplitude of the filtered output. This can be
%% modified to enable more or less spreading in the resultant spectrum
prn_amp=12e2;

%% Filter random values with this low-pass filter
filtered_prn=prn_amp.*(fjlter(Blpf,Alpf,rand(1,(2^logpts)+1e5))-.5);

%% Main delta-sigma loop
for i=1:2^logpts

%% The quantizer output is the last state variable, plus
%% the filtered noise multiplied by the fsbytwo term. The
%% padding of 1e5 in the filtered_prn is to remove the
%% ringing on the filtered output, since it's run thru
%% an IIR filter
%% Note that the filtered noise should only be added for small
%% signal levels. For large signals, the signal itself 'spreads'
%% the harmonics enough on its own. Also, the level of the noise
%% injected would cause Stability problems if the input was
%% near full-scale quantizer=floor(X(order)+(filtered_prn(i+1e5)).*fsbytwo);

%% Toggle the fsbytwo signal
fsbytwo=-fsbytwo;

%% clip the quantizer at its max value
   if (quantizer>qmax)
     quantizer=qmax;
   end
   if (quantizer<-qmax)
     quantizer=-qmax;
   end %% assign the output of the loop to the clipped output of the quantizer
   data_out(i)=quantizer;

%% Set the index for the correction matrix lookup table
   fb_index=floor((quantizer+qmax))+1;

%% Assign new state variables
   X=A*X - use_plus.*corr_plus(fb_index,:)' - use_minus.*corr_minus(fb_index,:)' + 1.*(B'.*in
put_sine(ceil(i./(samplehold))))    ;

%% switching from rising to falling edge
   if (use_plus==1)
     cem_out(((i-1)*(qlevels-1))+1:((i-1)*(qlevels-1))+(qlevels-1))= [cem_plus(fb_index,:)];
     cem_rising(((i-1)*(qlevels-1))+1:((i-1)*(qlevels-1))+(qlevels-1))= [cem_plus(fb_index,:]
;
elseif (use_minus==1)
     cem_out(((i-1)*(qlevels-1))+1:((i-1)*(qlevels-1))+(qlevels-1))= [cem_minus(fb_index,:)];
     cem_falling(((i-1)*(qlevels-1))+1:((i-1)*(qlevels-1))+(qlevels-1))= [cem_minus(fb_index,:
)];
   end %% toggle the use_plus and use_minus bits
use_plus=~use_plus;
use_minus=~use_minus;
end
```

FIGURE 10

```
function [corr_plus,corr_minus) = compute_corr_coeffs(A,a,g,cem_plus,cem_minus;
%% function [corr_plus,corr_minus) = compute_corr_coeffs(A,a,cem_plus,cem_minus);
%%
%% A is the state transition matrix
%% a are the feedback terms (the coefficients) -- designed for a
%%    feedback topology
%% g are the resonator terms
%% cem_plus/cerm_minus are the cem signals %% Compute the root of the transition matrix
%% matrix_power(matrix,value) computes matrix^-value
mn=matrix_power(A,2.*(length(cem_plus)-1));

%% Initialize the correction matrix so it runs faster
corr_plus=zeros(length(cem_plus),length(a));

%% Main loop that computes the product of the power of the transition
%% matrix and the CEM pulse at each point in the CEM pulse
for j=1:length(cem_plus)
  tot=zeros(length(a));
  for i=-(length(cem_plus)-2):2:length(cem_plus)-2
    tot=tot+(((mn^-1)))*cem_plus(j,ceil(i/2)+(length(cem_plus)-1)./2);
  end
  fb(j,:)=(tot*a')';
end %% Format matrices to the appropriate size for compatibility w/ the rest of
%% the model
corr_plus=fb'./2;
corr_plus=corr_plus';

%% Now perform the same operations on the minus CEM pulse

%% Initialize the correction matrix so it runs faster
corr_minus=zeros(length(cem_minus),length(a));

%% Main loop that computes the product of the power of the transition
%% matrix and the CEM pulse at each point in the CEM pulse
for j=1:length(cem_minus)
  tot=zeros(length(a));
  for i=-(length(cem_minus)-2):2:length(cem_minus)-2
    tot=tot+(((mn^-i)))*cem_minus(j,ceil(i/2)+(length(cem_minus)-1)./2);
end
fb(j, :)=(tot*a')'
end %% Format matrices to the appropriate size for compatibility w/ the rest of
%% the model
corr_minus=fb'./2;
corr_minus=corr_minus';
```

SIGNAL PROCESSING SYSTEM WITH MODIFIED DELTA SIGMA MODULATOR QUANTIZER OUTPUT SIGNALS TO SPREAD HARMONIC FREQUENCIES OF PULSE WIDTH MODULATOR OUTPUT SIGNALS

CROSS-REFERENCE TO RELATED APPLICATION

This application claims the benefit under 35 U.S.C. § 119(e) and 37 C.F.R. § 1.78 of U.S. Provisional Application No. 60/778,712, filed Mar. 3, 2006 and entitled "Electromagnetic Interference (EMI) Reduction for Pulse Width Modulation (PWM) with Coordinated Channels", inventors Johann Gaboriau and John Melanson (referred to herein as the "Gaboriau Application"). The Gaboriau Application includes exemplary systems and methods and is incorporated by reference in its entirety.

BACKGROUND OF THE INVENTION

1. Field of the Invention

The present invention relates in general to the field of information processing, and more specifically to a delta-sigma modulator-pulse-width modulator combination system and method for modifying delta sigma modulator quantizer output signals to spread harmonic frequencies of pulse width modulator output signals.

2. Description of the Related Art

Delta-sigma modulators (noise shapers) are particularly useful in digital-to-analog and analog-to-digital converters (respectively "DACs" and "ADCs"). Using oversampling, a delta-sigma modulator spreads quantization noise energy across the oversampling frequency band, which is typically much greater than the input signal bandwidth. Additionally, a delta sigma modulator performs noise shaping by acting as a lowpass filter to the input signal and a highpass filter to the quantization noise, thus, shifting most of the quantization noise energy out of the signal band.

Delta sigma modulators can be combined with a pulse width modulator (PWM) to implement a signal processing system data converter that converts an oversampled delta sigma modulator input signal into a directly corresponding pulse width modulated output signal. The pulse width modulated output signal can be used to, for example, drive a digital amplifier.

U.S. Pat. No. 5,815,102 entitled "Delta Sigma PWM DAC to Reduce Switching" to John Melanson, granted Sep. 29, 1998 (Melanson I), U.S. Pat. No. 6,150,969 entitled "Correction of Nonlinear Output Distortion in a Delta Sigma DAC" to John Melanson, granted on Nov. 21, 2000 (Melanson II), and U.S. Pat. No. 6,480,129 entitled "Methods and Apparatus for Correction of Higher Order Delta Sigma Converters" to John Melanson, granted on Nov. 12, 2002 (Melanson III), disclose exemplary ways for implementing delta-sigma modulator/PWM combinations and are all hereby incorporated by reference.

Referring to FIG. 1, signal processing system 100 represents one utilization of a delta sigma modulator 102—PWM 104 combination. Delta sigma modulator 102 receives a digital input signal x(n) having an oversampling frequency of $f_{OS}$. The oversampling frequency $f_{OS}$ also represents the operating frequency of the delta sigma modulator 102. "(n)" represents a particular sample of the referenced signal, and the referenced signal generally includes many samples. The data represented by input signal x(n) is originally sampled at sampling frequency $f_S$. Thus, an oversampling ratio (OSR) of delta-sigma modulator 102 equals $f_{OS}/f_S$. Delta sigma modulator 102 provides a noise shaped quantizer output signal q(n) to PWM 104. Each quantizer output signal q(n) is a digital data stream representing one of N different quantization levels. In at least one embodiment, the number of different quantization levels N equals the OSR+1, where N is a positive integer. For example, the $n^{th}$ sample of quantizer output signal q(n) represents the $n^{th}$ sample of input signal x(n) with one of N different quantization levels, i.e. q(n)∈{0, 1, ..., N−1}. The quantizer output signal q(n) is the input signal to PWM 104.

The PWM output signal y(n) is a series of frames with each frame having a period T. In each frame, PWM 104 generates a respective PWM pattern. Each PWM pattern represents a quantization level of quantizer output signal q(n). The period T of each PWM output signal frame equals $1/f_{OS}$. For each frame of a PWM output signal y(n), the duty cycle of the PWM output signal equals the pulse width duration divided by the period T. Additionally, each frame of PWM output signal y(n) can be divided into $f_{OS}/f_S$ (i.e. N−1) discrete time slots. The time slots are defined by a quanta of time and by their position in time relative to the start of the associated PWM pattern. Each time slot $t_{F_i}$ can be coded with a logical "1" or a logical "0", where the number of logical 1's in a frame defines the pulse width of the frame of PWM output signal y(n) and F is the frame number and I is the time slot within the frame. The "pulse starting time" of each pulse in a PWM pattern refers to the time when the rising edge of the pulse occurs.

FIG. 2 depicts PWM patterns 200 for representative quantization levels in Table 1. Table 1 represents one example of the PWM patterns for N=65 quantization levels. The PWM output signals of Table 1 represent "centered, grow from the right" patterns with the odd quantization levels (1, 3, 5, ...) having right centered pulses and the even quantization levels (2, 4, ...) having centered pulses. Other patterns, such as grow from the left or non-centered pulses, can also be used to represent quantization levels. The PWM 104 selects a PWM pattern for each received sample of quantizer output signal q(n). Thus, each PWM pattern has a one-to-one (1:1) association with a quantization level as depicted in Table 1. Quantization levels 29-35 represent exemplary low level signals. In Table 1, "Leading Zeros" represents the number of logical "zeros" at the beginning of a PWM pattern. "Ones" represent the duration of logical "ones" in the PWM pattern following the Leading Zeros, and thus, the Ones represent the "pulse" in the PWM pattern. The total number of logical ones times the duration of each time slot in a frame of PWM output signal y(n) equals the duration of the pulse width. "Trailing Zeros" represent the number of logical "zeros" after the pulse in the PWM pattern.

TABLE 1

| Quantization Level | PWM Patterns | | |
| --- | --- | --- | --- |
|  | Leading Zeros | Ones | Trailing Zeros |
| 0 | 32 | 0 | 32 |
| 1 | 32 | 1 | 31 |
| 2 | 31 | 2 | 31 |
| 3 | 31 | 3 | 30 |
| ... | ... | ... | ... |
| 29 | 18 | 29 | 17 |
| 30 | 17 | 30 | 17 |
| 31 | 17 | 31 | 16 |
| 32 | 16 | 32 | 16 |
| 33 | 16 | 33 | 15 |

TABLE 1-continued

| Quantization | PWM Patterns | | |
|---|---|---|---|
| Level | Leading Zeros | Ones | Trailing Zeros |
| 34 | 16 | 34 | 15 |
| 35 | 15 | 35 | 14 |
| ... | ... | ... | ... |
| 62 | 1 | 62 | 1 |
| 63 | 1 | 63 | 0 |
| 64 | 0 | 64 | 0 |

Referring to FIG. 1, the PWM output signal y(n) drives amplifier 106. The amplifier 106 in turn drives a load 108 represented by impedance Z. Load 108 is, for example, one or more audio speakers or a servo motor. In at least one embodiment, the amplifier 106 includes switches 112 and 114 that change conductivity in conjunction with the pulses of PWM output signal y(n). In some applications, amplifier 106 represents a power amplifier and has a relatively high maximum voltage, such as +30 V, and high maximum current, such as 5 A. Various factors, such as the parasitic capacitances 116 and 118 and parasitic inductance 120, cause the amplifier 106 to radiate energy at the switching frequency of switches 112 and 114 and at other harmonic frequencies of the switching frequency. It is difficult to shield this radiated energy and, thereby, prevent leakage into the rest of the system 100. Additionally, the resulting electromagnetic interference (EMI) from the radiated energy can easily exceed local EMI standards.

Audio input signals x(n) that cause pure or approximate square wave PWM patterns in frames of PWM output signal y(n) present particularly acute, potential EMI problems with system 100. Delta sigma modulator 102 quantizes each low level input signal sample as alternating or approximately alternating high and low levels. Thus, low level signals (such as pauses or silence represented by, for example, quantization levels 29-35 in Table 1 and FIG. 2) are the most common cause for the generation of pure or approximate square wave PWM patterns by PWM 104. As depicted in Table 1 and FIG. 2, quantization levels 29-35 each cause the PWM 104 to generate a frame of pure or approximate square waves. Square waves and approximate square waves present particularly problematic EMI problems because the switching frequency of switches 112 and 114 approximately equals the oversampling frequency $f_{OS}$, and the oversampling frequency $f_{OS}$ and/or harmonics of the oversampling frequency $f_{OS}$ often reside in the radio frequency spectrum. For example, when $f_{OS}$=384 kHZ, system 100 radiates energy at 384 kHz and at harmonic frequencies of 384 kHz. The radiated energy in the spectrum of harmonic frequencies of PWM output signal y(n) can be significant and exceed local EMI standards.

FIG. 3 depicts a frequency analysis 300 of the harmonic frequencies of 384 MHz square waves in repetitive frames of PWM output signal y(n) between 0 and 6 MHz and energy levels between 0 and −80 dB. The square waves have significant energy at the fundamental harmonic frequency of 384 kHz and significant energy at higher harmonic frequencies in the radio frequency (RF) spectrum. For example, the amplitudes of the $3^{rd}$, $5^{th}$, and $7^{th}$ harmonics are respectively −12 dB, −16 dB, and −19 dB.

SUMMARY OF THE INVENTION

In one embodiment of the present invention, a method includes receiving a set of delta sigma modulator input samples and generating delta sigma modulator loop filter output samples in response to receiving the delta sigma modulator input samples. The method also includes generating delta sigma modulator quantizer output samples and modifying the quantizer output samples with a modification signal to generate modified quantizer output samples. The method further includes modulating the modified quantizer output samples to generate pulses in a pulse width modulator output signal. Each pulse has a pulse start time and a pulse end time relative to a beginning of a respective frame of the pulse width modulator output signal and the modification signal causes pulse start times and pulse end times of the pulses to differ sufficiently from pulse start times and pulse end times of unmodified quantizer output samples to reduce energy levels of at least the $3^{rd}$ and $5^{th}$ harmonic frequencies of the pulse width modulator output signal by at least 3 dB relative to energy levels of the $3^{rd}$ and $5^{th}$ harmonic frequencies of a pulse width modulated output signal generated with unmodified quantizer output samples.

In another embodiment of the present invention, a method includes receiving a set of delta sigma modulator input samples and generating delta sigma modulator loop filter output samples in response to receiving the delta sigma modulator input samples. The method further includes generating a pre-modification output signal, low pass filtering the pre-modification signal, and modulating the pre-modification signal up to a modulation frequency to generate the modification signal. The method also includes generating delta sigma modulator quantizer output samples, modifying the quantizer output samples with the modification signal to generate modified quantizer output samples, and modulating the quantizer output samples to generate pulses in a pulse width modulator output signal.

In a further embodiment of the present invention, a signal processing system includes a delta sigma modulator. The delta sigma modulator includes an input to receive a set of delta sigma modulator input samples, a loop filter, coupled to the input, to generate delta sigma modulator loop filter output samples in response to receiving the delta sigma modulator input samples, a quantizer, coupled to the loop filter, to generate delta sigma modulator quantizer output samples, and an output modifier, coupled to the quantizer, to generate a modification signal and modify the quantizer output samples with the modification signal to generate modified quantizer output samples. The signal processing system also includes a pulse width modulator, coupled to the delta sigma modulator, to modulate the quantizer output samples and to generate pulses in a pulse width modulator output signal. Each pulse has a pulse start time and a pulse end time relative to a beginning of a respective frame of the pulse width modulator output signal and the modification signal causes pulse start times and pulse end times of the pulses to differ sufficiently from pulse start times and pulse end times of unmodified quantizer output samples to reduce energy levels of at least the $3^{rd}$ and $5^{th}$ harmonic frequencies of the pulse width modulator output signal by at least 3 dB relative to energy levels of the $3^{rd}$ and $5^{th}$ harmonic frequencies of a pulse width modulated output signal generated with unmodified quantizer output samples.

In another embodiment of the present invention, a signal processing system includes a delta sigma modulator. The delta sigma modulator includes an input to receive a set of delta sigma modulator input samples, a loop filter, coupled to the input, to generate delta sigma modulator loop filter output samples in response to receiving the delta sigma modulator input samples, and a modification signal source to generate a pre-modification output signal. The delta sigma modulator further includes a low pass filter, coupled to the modification signal source, to low pass filter the pre-modification signal, a modulator, coupled to the low pass filter, to modulate the pre-modification signal up to a modulation frequency to generate a modification signal, and a quantizer, coupled to the loop filter, to generate delta sigma modulator quantizer output samples. The delta sigma modulator also includes a modification component, coupled to the quantizer, to modify the quantizer output samples with the modification signal to generate modified quantizer output samples. The signal processing system further includes a pulse width modulator, coupled to the delta sigma modulator, to modulate the modified quantizer output samples to generate pulses in a pulse width modulator output signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 9 and 10 depict exemplary MATLAB® code to simulate an embodiment of the delta-sigma modulator of FIG. 4 with consecutive edge modulation.

FIG. 11 depicts exemplary MATLAB® code for computing loop filter correction factors.

DETAILED DESCRIPTION

Figure 1:
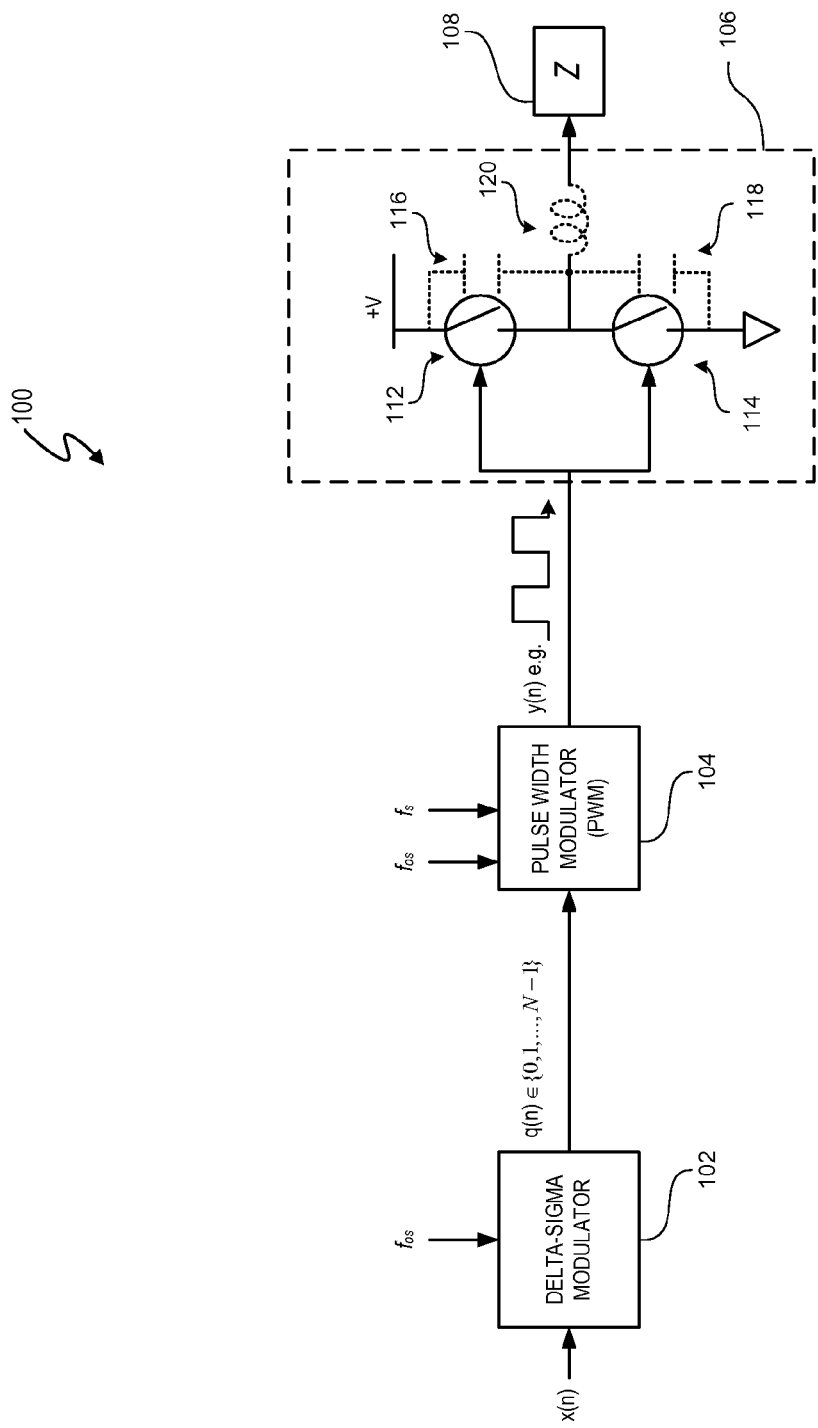
FIG. 1 (labeled prior art) depicts a signal processing system with a delta sigma modulator followed by a pulse width modulator (PWM).
Figure 2:
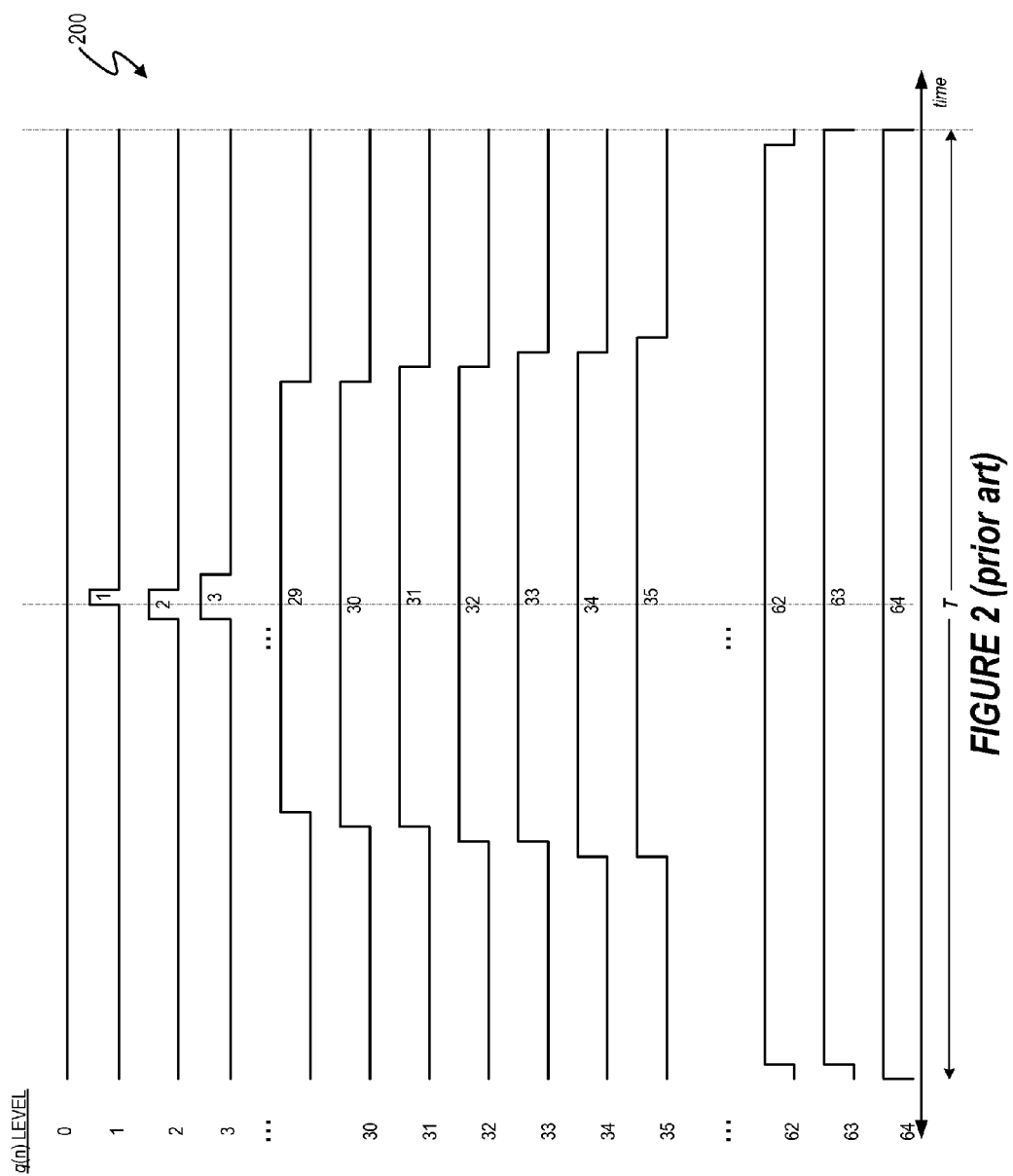
FIG. 2 (labeled prior art) depicts PWM output signals for various quantization levels.
Figure 3:
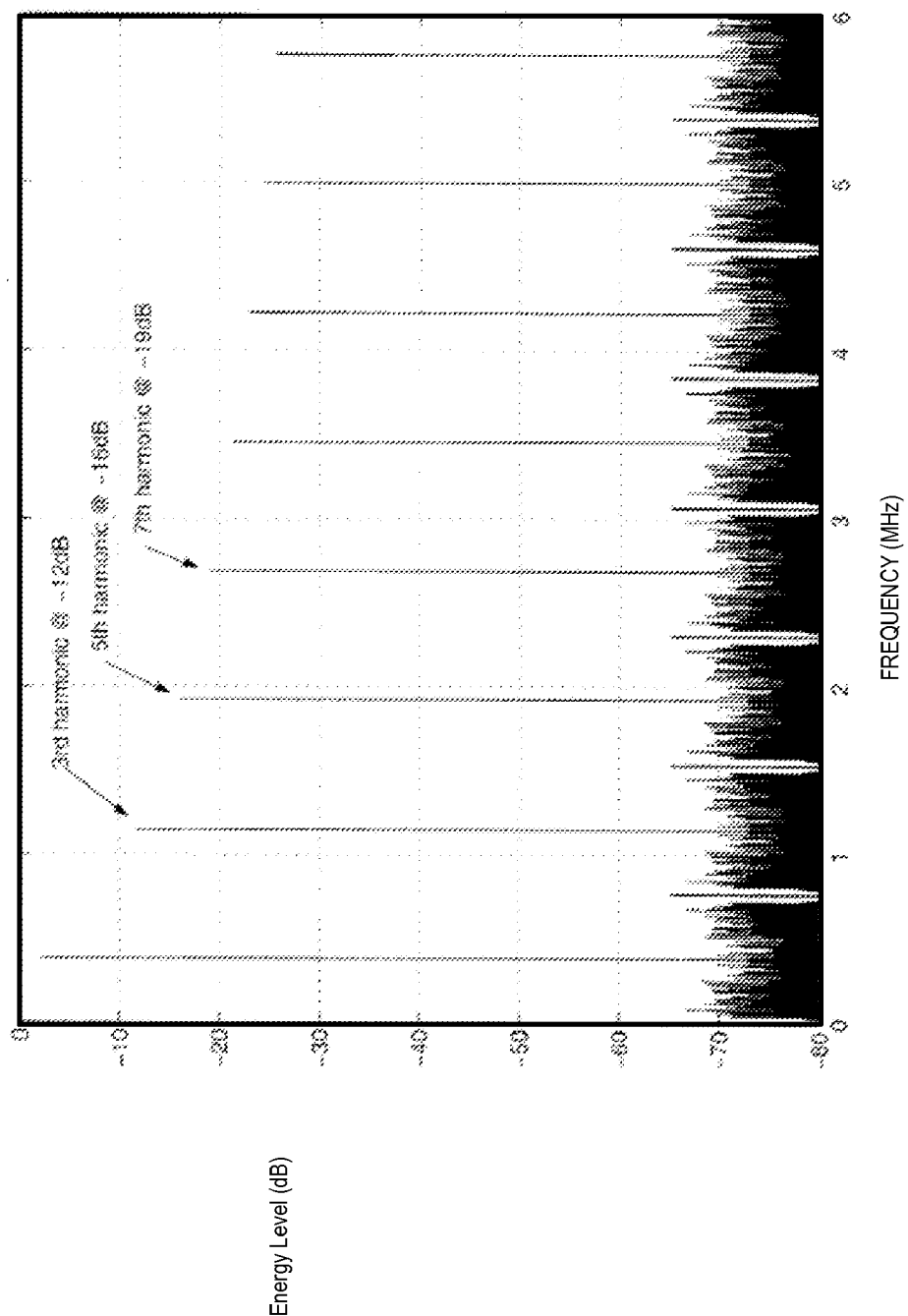
FIG. 3 (labeled prior art) depicts a frequency analysis of harmonic frequencies of 384 MHz square waves between 0 and 6 MHz.

The signal processing system includes a pulse width modulator (PWM) that receives input signals from a delta sigma modulator. The PWM generates an output signal having successive frames of PWM patterns. In at least one embodiment, the delta-sigma modulator includes a loop filter and a quantizer, and output samples of the quantizer are modified by a spectrum spreading modification signal to subsequently spread the spectrum of harmonic frequencies in the PWM output signal. In at least one embodiment, loop filter signal samples are directly modified and cause modification of the quantizer output samples, which in turn causes pulse edges of PWM patterns to shift in time relative to PWM output signals based on unmodified quantizer output signal samples. In another embodiment, the quantizer output signals are directly modified and cause pulse edges of PWM patterns to shift in time relative to PWM output signals based on unmodified loop filter output signal samples. The signal processing system shifts the rising edges of each PWM pattern in time relative to the start of each PWM pattern by a quanta of time greater than any differences between the pulse widths of each PWM pattern. Shifting the rising edges spreads the spectrum of harmonic frequencies of the PWM output signal. Duty cycles of the pulses are also modified. However, the average duty cycle over time of a signal remains constant or approximately constant and, thus, does not add noise to low frequencies, such as audio frequencies.

In at least one embodiment, the loop filter output signal is modified by modulating low pass filtered random noise and adding the modulated noise to the loop filter output signal. Modifying the loop filter output signal modifies a delta-sigma modulator quantizer output signal, which in turn changes the frame-to-frame duty cycles of the pulse width modulator output. Changing the frame-to-frame duty cycles shifts the pulse edges of pulses in frames of the pulse width modulator output. In at least one embodiment, the signal processing system can discriminate between loop filter output signal samples corresponding to low-level and high-level delta-sigma input and modify only the loop filter output signal samples corresponding to the low-level input signal samples since typically the low-level input signal samples cause the PWM to generate the most energy at harmonic frequencies in the RF spectrum.

In at least one embodiment of an audio signal processing system, to generate the loop filter output modification signal, a low pass filter filters a random noise signal, and the filtered noise signal is modulated to one-half of the output frequency of the loop filter. In at least one embodiment, the delta-sigma modulator operates in consecutive edge modulation (CEM) mode, and the filtered noise signal is modulated at the oversampling frequency $f_{OS}$ of input signal x(n) divided by two and then added to the loop filter output signal.

Thus, the signal processing system spreads the spectrum of harmonic frequencies of the PWM output signal while leaving in-band frequencies unaffected. In at least one embodiment, the signal processing system is a multi-channel system that generates a respective PWM output signal for each channel. In addition to intra-channel shifting of pulse edges, the multi-channel system shifts edges of each channel to reduce inter-channel overlap in time of falling and rising pulse edges, thereby spreading the spectrum of harmonic frequencies of all the PWM output signals to reduce electromagnetic interference (EMI).

Figure 4:
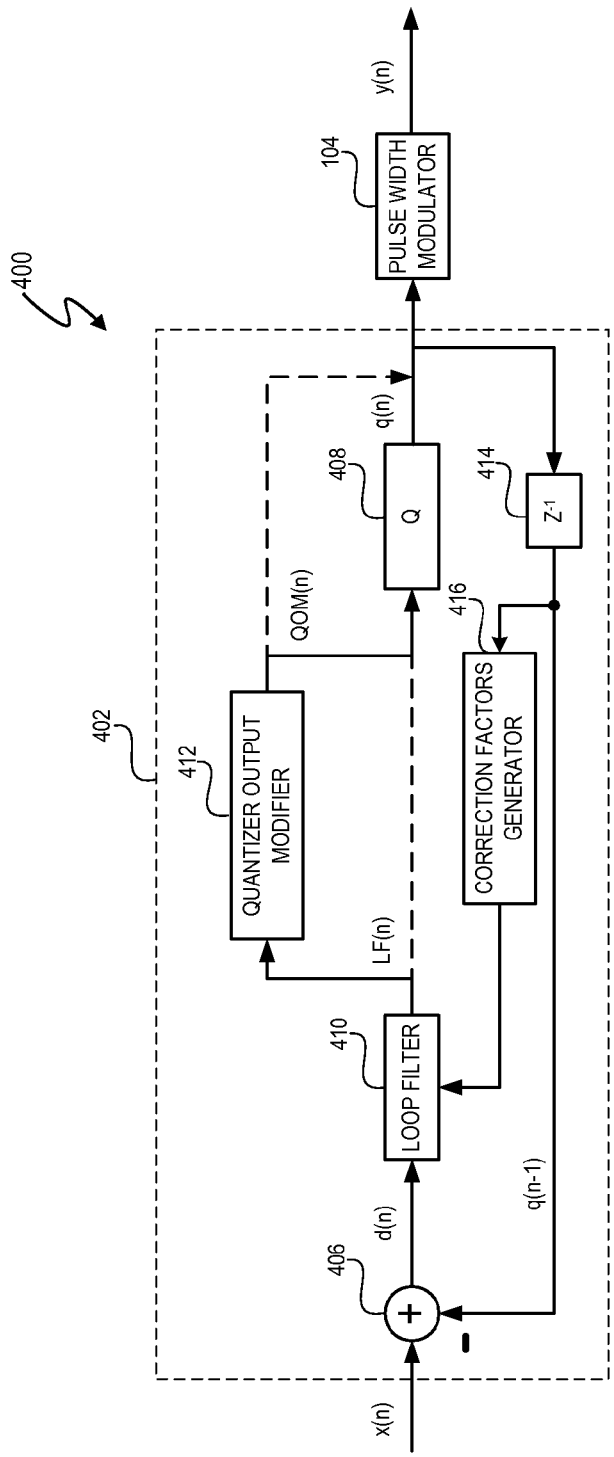
FIG. 4 depicts a signal processing system that includes a delta sigma modulator with an output modifier combined with a pulse width modulator.

FIG. 4 depicts signal processing system 400, which includes delta sigma modulator 402 combined with pulse width modulator 104 to encode delta sigma modulator input signal x(n) into a PWM output signal y(n). "n" generally represents the $n^{th}$ sample of a signal, and, more specifically with reference to PWM output signal y(n), "n" represents a particular frame of PWM output signal y(n). The delta sigma modulator 402 includes output modifier 412 that causes the shifting of pulse edges of PWM patterns in frames of PWM output signal y(n). The input signal x(n) can be a sampled analog signal or a digital signal.

The quantizer 408 of delta-sigma modulator 402 generates a quantizer output signal q(n). The quantizer output signal q(n) is a digital data stream of one-bit or multibit quantizer outputs. Each sample of quantizer output signal q(n) represents one of N different quantization levels. The oversampling ratio (OSR) of delta-sigma modulator 402 equals $f_{OS}/f_S$. In at least one embodiment, the number of different quantization levels N equals the oversampling ratio (OSR)+1, where N is a positive integer. For example, the $n^{th}$ sample of quantizer output signal q(n) represents the $n^{th}$ sample of input signal x(n) with one of N different quantization levels, i.e. q(n)$\in$\{0, 1, . . . , N−1\}. The quantizer output signal q(n) is the input signal to PWM 104. The delta sigma modulator 402 feeds back each bit of quantizer output signal q(n), and summing node 406 subtracts the current sample of input signal x(n) from the bits of the previous quantizer output signal q(n−1) to generate a delta signal d(n) for each bit of the previous quantizer output signal q(n−1). The $z^{-1}$ delay 414 indicates that the quantizer feedback signal q(n−1) is the immediately previous version of the quantizer output signal q(n).

Loop filter 410 generally includes one or more integrators to filter the delta signal d(n) and generate a loop filter output signal LF(n). In at least one embodiment, the output modifier 412 modifies the loop filter output signal LF(n) to generate quantizer output modification signal QOM(n). In at least one embodiment, the loop filter output signal LF(n) is the last state variable of the loop filter 412. In at least one embodiment, the quantizer output modification signal QOM(n) is provided to the quantizer 408 as a quantizer input signal. The quantizer output modification signal QOM(n) causes the quantizer output signal q(n) to change relative to an input of an unmodified loop filter output signal LF(n). The modified loop filter output signal LFM(n) ultimately causes a spreading of the spectrum of harmonic frequencies of the PWM output signal y(n) by modifying the quantizer output signal q(n). In at least one other embodiment, as indicated by the dashed lines exiting loop filter 410 and output modifier 412, loop filter 410 provides the unmodified loop filter output signal LF(n) to quantizer 408, and output modifier 412 modifies the quantizer output signal q(n) with quantizer output modification signal QOM(n) to generate a modified quantizer output signal. In both embodiments, the quantizer output signal q(n) is modified which spreads the spectrum of harmonic frequencies of the PWM output signal y(n). In another embodiment, the quantizer output modifier 412 modifies both the loop filter output signal LF(n) and the quantizer output signal q(n).

In at least one embodiment, the number of bits in the output modification signal QOM(n) match the number of bits in the loop filter output signal LF(n) or, in another embodiment, match the number of bits in the quantizer output signal q(n). Generally, the quantizer output signal q(n) has less bits than the filtered pre-modification signal RNF. Thus, the output modification signal QOM(n) can be quantized before modifying quantizer output signal q(n) so that output modification signal QOM(n) matches the number of bits in quantizer output signal q(n).

In at least one embodiment, as explained subsequently in more detail, the output modifier 412 modifies the loop filter output signal LF(n) so that samples of quantizer output signal q(n) vary over time even when the delta sigma modulator input signal x(n) remains constant or approximately constant over a length of time. Thus, the pulse edges of frames of output signal y(n) corresponding to the approximately constant samples of input signal x(n) shift relative to each other. The shifting pulse edges spread the spectrum of harmonic frequencies in the PWM output signal y(n). In at least one embodiment, output modifier 412 selectively modifies the loop filter output signal LF(n) or the quantizer output signal q(n) depending upon the level of input signal x(n) samples. For example, as previously described, PWM output frames of pure or approximate square waves present particularly problematic EMI problems in, for example, power switching applications. Thus, in one embodiment, output modifier 412 modifies a sample of loop filter output signal LF(n) or the quantizer output signal q(n) only if the sample corresponds to a low level value of a sample input signal x(n). Modifying only samples of loop filter output signal LF(n) corresponding to low-level samples of input signal x(n) helps prevent overload of quantizer 408.

The pulse width modulator 104 receives each sample of quantizer output signal q(n) and generates a frame of pulse width output signal y(n) by converting each quantizer output signal sample q(n) into a frame of the pulse width output signal y(n). Each PWM pattern represents a quantization level of quantizer output signal q(n). The period T of each PWM output signal frame equals $1/f_{OS}$. For each frame of a PWM output signal y(n), the duty cycle of the PWM output signal equals the pulse width duration divided by the period T. Additionally, each frame of PWM output signal y(n) can be divided into $f_{OS}/f_S$ (i.e. N−1) discrete time slots. The time slots are defined by a quanta of time and by their position in time relative to the start of the associated PWM pattern. Each time slot $t_{Fi}$ can be coded with a logical "1" or a logical "0", where the number of logical 1's in a frame defines the pulse width of the frame of PWM output signal y(n) and F is the frame number and I is the time slot within the frame. The "pulse starting time" of each pulse in a PWM pattern refers to the time when the rising edge of the pulse occurs.

Delta sigma modulator 402 includes a correction factor generator 416 to generate correction factors for one or more respective integrators of loop filter 410. The correction factors provide correction for non-linearities in the PWM output signal y(n) caused by, for example, the PWM patterns. The signal processing 400 can be implemented using hardware and/or a combination of hardware and software.

Figure 5:
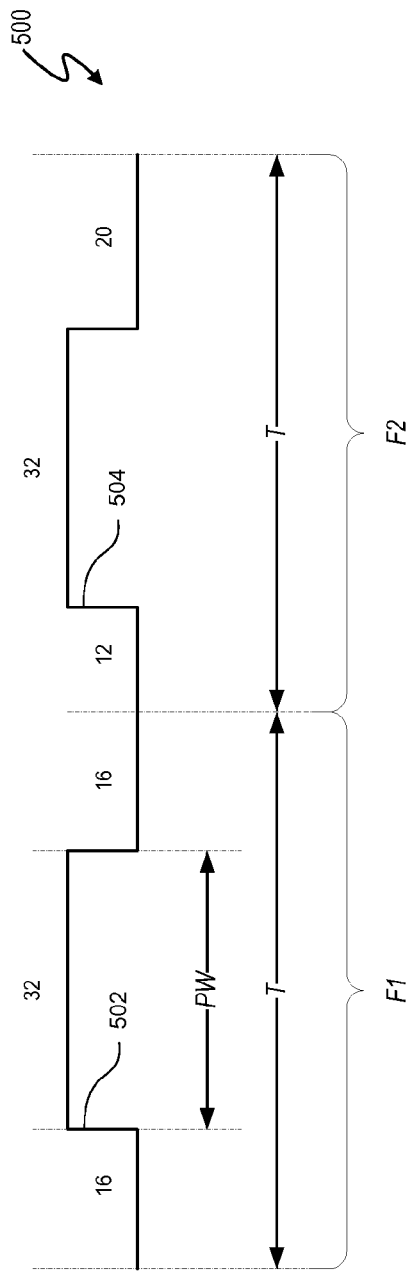
FIG. 5 depicts two exemplary frames of a pulse width modulator output signal.

FIG. 5 depicts two exemplary frames F1 and F2 of a PWM output signal y(n) 500. The output frequency of quantizer 408 and PWM 104 is 1/T, and $1T=1/f_{OS}$. Each of frames F1 and F2 has a period (duration) equal to T, and a pulse width of PW. The duty cycle of each frame equals the ratio of PW to T times 100%, i.e. PW/T×100%. The duty cycles of frames F1 and F2 both equal 50%, i.e. 32/64× 100%. Each frame of pulse width output signal y(n) can be constructed by a series of N bits. Frame F1 is constructed from 16 leading zeros, followed by 32 ones, and followed by 16 trailing zeros. Frame F2 is constructed from 12 leading zeros, followed by 32 ones, and followed by 20 trailing zeros. Thus, the pulse start time of frame F1 is 18/64·T, and the pulse start time of frame F2 is 12/64·T. The difference in the pulse start times of frame F1 and F2 is $$\left(\frac{16-12}{64}\right) \cdot T,$$

which causes the spreading of harmonic frequencies in the PWM output signal y(n). The duty cycle of each pulse directly corresponds to a quantization level. For a delta-sigma modulator oversampling ratio of 64, there are 65 possible duty cycles varying from 0-100% as illustrated in Table 1. In at least one embodiment, the output modifier 412 does not cause the duty cycle of a frame y(n) to change, but rather shifts the pulse in time, i.e., changes the pulse start times, by changing the number of leading zeros of the frame relative to an unmodified PWM output signal sample y(n). In at least one embodiment, the number of 'ones' remains the same, thus, the pulse widths are unmodified.

Figure 6:
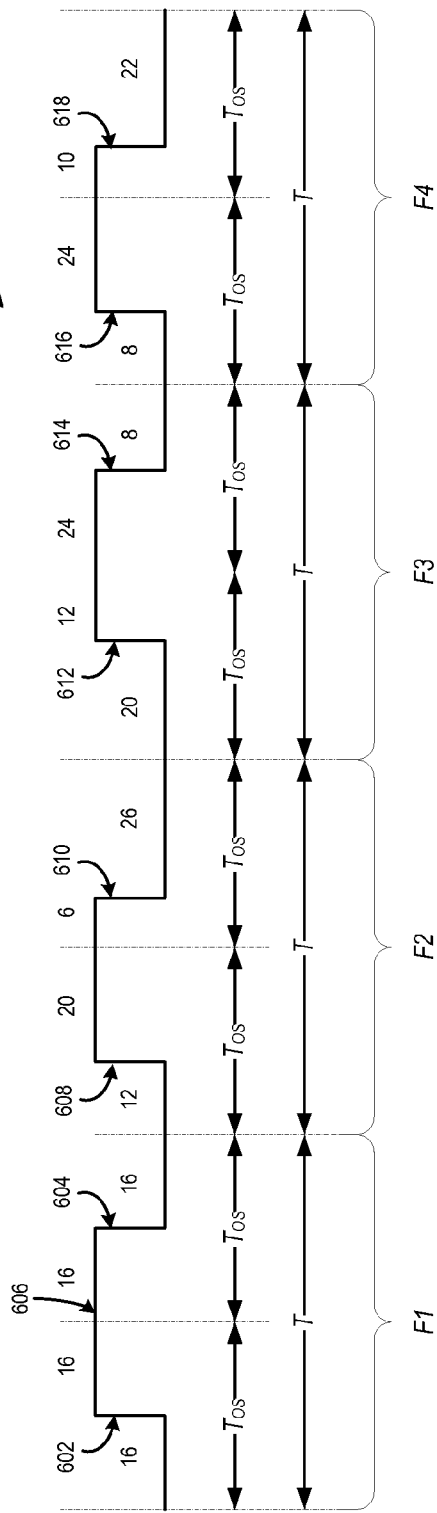
FIG. 6 depicts two exemplary frames F1 and F2 of a pulse width modulator output signal generated using consecutive edge modulation.

Referring to FIGS. 4 and 6, in at least one embodiment the operating frequency of delta sigma modulator 402 is $f_{OS}$. In at least one other embodiment, signal processing system 400 uses consecutive edge modulation (CEM) to generate pulse width modulation output signal y(n). FIG. 6 depicts four exemplary frames F1, F2, F3, and F4 of a pulse width output signal y(n) 600 generated using consecutive edge modulation (CEM). In CEM, the delta-sigma modulator 402 can operate at twice the oversampling frequency without altering the PWM output period T. CEM uses the quantizer output signal q(n) to specify the rising edge 602 and the falling edge 604 of pulse 606 in frame F1, the rising edge 608 and the falling edge 610 of frame F2, the rising edge 612 and the falling edge 614 of frame F3, and the rising edge 616 and the falling edge 618 of frame F4 of pulse width modulator output signal y(n).

Figure 7:
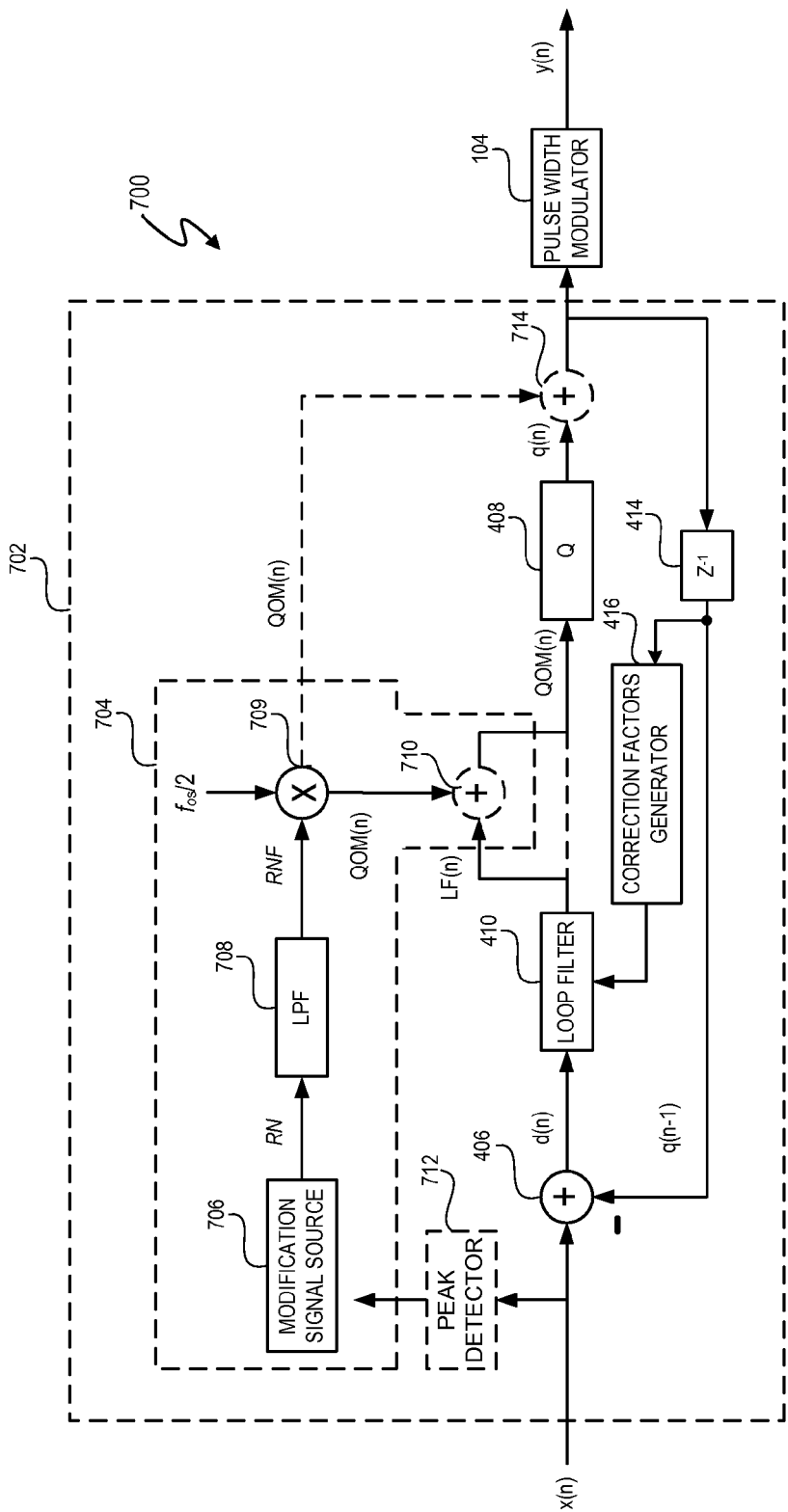
FIG. 7 depicts a signal processing system representing one embodiment of the signal processing system of FIG. 4.

FIG. 7 depicts signal processing system 700, which represents one embodiment of signal processing system 400. Signal processing system 700 modifies loop filter output signal LF(n) of delta sigma modulator 702 to encode delta sigma modulator input signal x(n) into a pulse width modulated output signal y(n) and spreads the spectrum of harmonic frequencies of output signal y(n). The output modifier 704 represents one embodiment of output modifier 412. The output modifier 704 generates an output modification signal QOM(n) that is, in at least one embodiment, added to loop filter output signal LF(n) by a modification component, such as summer 710, to modify the output signal of the loop filter LF(n). Modifying the loop filter output signal LF(n) modifies the quantizer output signal q(n). In at least one other embodiment, as indicated by the dashed lines exiting loop filter 410 and modulator 709 and the dashed lines of summer 714, summer 714 adds the output modification signal QOM(n) to the quantizer output signal to generate a modified quantizer output signal. The modified quantizer output signal causes pulse width modulator 104 to shift pulse edges of PWM output patterns in time with respect to unmodified PWM output patterns generated by an unmodified loop filter output signal LF(n). Thus, for example, when the delta-sigma modulator input signal x(n) is at a low level for a time duration of Td, the resulting PWM patterns in frames of y(n) will have varying duty cycles, which causes the edges of the pulses in the PWM patterns to shift in time relative to the beginning of each frame by an amount of time greater than any shifting caused by variations in quantization levels alone. Td is a duration in time "d" times greater than the frame period T, and "d" is a positive number greater than one. Thus, the rising and falling edges of each pulse will be shifted in time to different time slots in the frames. Accordingly, the time span between successive rising edges and successive falling edges varies. The greater the variation between rising edge start times in the frames of PWM output signal y(n), the more the spectrum of harmonic frequencies of PWM output signal y(n) is spread.

The output modifier 704 includes a modification signal source 706 that generates a time-varying, output pre-modification signal RN. In one embodiment, the modification signal source 706 is a random signal generator, and, thus, the pre-modification signal RN is a random signal. In at least one embodiment, the bandwidth of the pre-modification signal RN is limited to prevent introduction of noise into a baseband, such as an audio baseband of 0-25 kHz. To reduce the bandwidth of the pre-modification signal RN, low pass filter 708 filters the pre-modification signal RN to generate the filtered pre-modification signal RNF. The cut-off frequency of low pass filter 708 is a matter of design choice. The variance of frame-to-frame pulse start and end times directly corresponds to the amount of spreading of the harmonic frequencies of the PWM output signal y(n). In at least one embodiment, the variance of frame-to-frame pulse start and end times also results in a variance of duty cycles. However, for a given input signal, the average duty cycle is unaffected. A higher cut-off frequency on average "spreads" the harmonic frequencies in pulse width modulator output signal y(n) more than a lower cut-off frequency by varying the frame-to-frame pulse start and end times more. In at least three embodiments, the respective cut-off frequencies are 1 kHz, 2 kHz, and 3 kHz.

The output modifier 704 modulates the filtered pre-modification signal RNF by the oversampling frequency $f_{OS}$ divided by 2 to generate output modification signal QOM (n). In at least one embodiment, a multiplier 709 functions as a modulator to multiply the pre-modification signal RNF by $f_{OS}/2$. Referring to FIGS. 6 and 7, in at least one embodiment during a time duration equal to 4×T, frames F1, F2, F3, and F4 encode identical samples of input signal x(n). By modulating the filtered pre-modification signal RNF by $f_{OS}/2$, in CEM mode the output modification signal QOM(n) modifies the quantizer output, which changes the frame-to-frame duty cycle of the resultant PWM output signal y(n) and shifts the frame-to-frame pulse start and end times. The amount of frame-to-frame variation depends upon the value of the output modification signal QOM(n). By first low-pass filtering and then modulating the filtered pre-modification signal RNF by the oversampling frequency $f_{OS}$ divided by 2, there is no adverse impact on the baseband (e.g. 0-25 kHz) performance, as all the inserted noise is centered at the $f_{OS}/2$ frequency (e.g. 192 kHz=(384/2) kHz). In an unmodified system, the PWM output pulses would be identical, and consist of 16 leading zeroes, 32 ones, and 16 trailing zeroes. Inserting the output modification signal QOM(n) changes the frame-to-frame variation in duty cycles and frame-to-frame pulse start and end times. However, over longer periods of time, the equality of high time and low time is preserved, e.g. the duty cycles of frames F1, F2, F3, and F4 average to 32. In at least one embodiment, modification of the loop filter output signal LF and modification of the quantizer output signal q(n) can be used in a non-CEM delta sigma modulator by, for example, modulating the signal pre-modification signal RNF by the oversampling frequency $f_{OS}$.

The particular type of output modification signal QOM(n) to modify the quantizer output signal q(n) is a matter of design choice. In at least one embodiment, the output modification signal QOM(n) causes frame-to-frame changes in pulse width of at least one third of a period T (T/3) to substantially reduce or remove $3^{rd}$ harmonic frequencies in PWM output signal y(n). The frame-to-frame changes in pulse width also spread the spectrum of higher order harmonic frequencies.

In at least one embodiment, signal processing system 700 also includes a peak detector 712 to detect peak values of samples of the input signal x(n). Adding the output modification signal QOM(n) to higher level signals can cause instability problems in signal processing system 700. Thus, in one embodiment, the output modifier 704 only adds the output modification signal QOM(n) to the loop filter output signal LF(n) when the peak detector 712 indicates to the output modifier 704 that the input signal x(n) sample is low level signal. In at least one embodiment, the threshold to determine whether a signal is a low level signal is established based upon stability of the signal processing system 700 so that the output modification signal QOM(n) is not added to the loop filter output signal LF(n) if the addition of the output modification signal QOM(n) would cause the signal processing system 700 to become unstable. In another embodiment, a predetermined threshold is set to define a low level signal as any sample of input signal x(n) having a peak value of at least 20 dB below a full scale peak value of input signal x(n). Thus, if the peak detector 712 determines that the peak value of the current sample of input signal x(n) is above 20 dB of the maximum value of input signal x(n), the output modification signal QOM(n) is not added to the loop filter output signal LF(n). High level signal samples generally vary over time naturally and, thus, generally do not generate undesirably high energy at the harmonic frequencies of the PWM output signal y(n). Thus, in general, restricting the addition of the output modification signal QOM(n) to the low-level signals does not adversely impact the performance of the signal processing system 700 in spreading the spectrum of harmonic frequencies in the PWM output signal y(n).

The remainder of delta-sigma modulator 702 and PWM 104 operates as previously described with reference to signal processing system 400 of FIG. 4.

Figure 8:
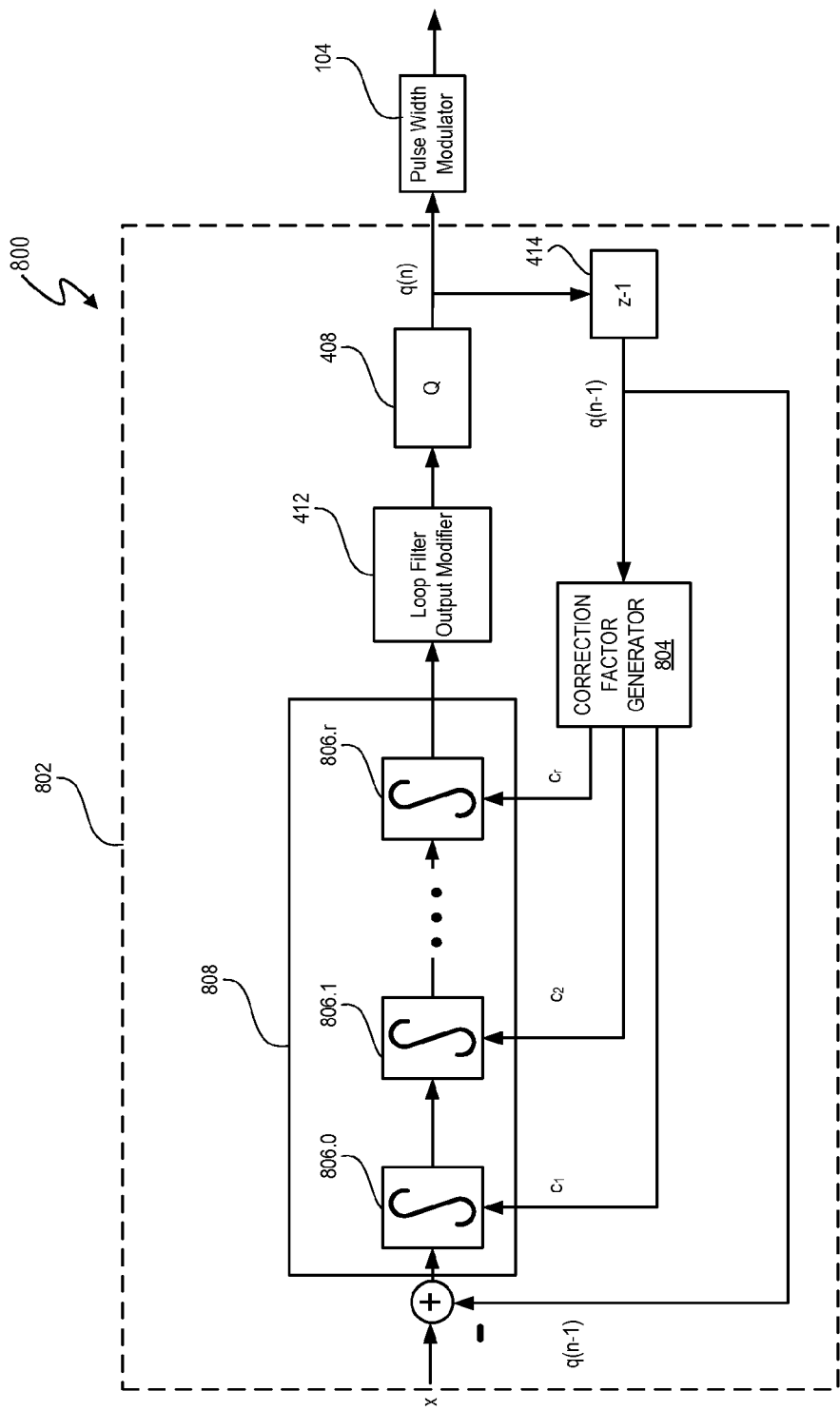
FIG. 8 depicts another signal processing system representing one embodiment of the signal processing system of FIG. 4.

FIG. 8 depicts signal processing system 800, which includes delta-sigma modulator 802. Delta-sigma modulator 802 represents one embodiment of delta-sigma modulator 402. Delta sigma modulator 802 includes a correction factor generator 804 to generate correction factors $c_0, c_1, \ldots, c_r$ for respective integrators 806.0, 806.1, . . . , 806.r of exemplary loop filter 808. Correction factor generator 804 represents one embodiment of correction factor generator 416. The correction factors $c_0, c_1, \ldots, c_r$ provide correction for non-linearities in the selected PWM output signal y(n) caused by, for example, the PWM patterns. In another embodiment, correction factors are generated for at least one but not all of the integrators 806.0, 806.1, . . . , 806.r.

In at least one embodiment, correction factors $c_0, c_1, c_r$ are stored in a memory, such as a read-only memory (ROM) and indexed by quantization level, and integrator identifier. The quantizer output signal q(n) of quantizer 408 is fed back via delay 414 to summing node 406 to add −q(n−1) to the input signal sample x(n). In at least one embodiment, the correction factor generator only depends on the PWM output signal y(n). Thus, as long as there is a 1:1 relationship between quantizer output quantizer output signal q(n) and frame outputs in the PWM output signal y(n), the correction factor generator only uses input from the quantizer output signal q(n) to generate the correction factors.

From the quantization level indicated by the quantizer output signal q(n) and the respective identifiers for integrators 806.0, 806.1, . . . , 806.r, the correction factor generator 804 can select and provide the appropriate correction factor to each of the r+1 integrators 806.0, 806.1, . . . , 806.r. The individual correction factors $c_0, c_1, \ldots, C_r$ can be determined, for example, as described in the MatLab® code of FIG. 11.

FIGS. 9 and 10 depict exemplary MATLAB® code to simulate an embodiment of delta-sigma modulator 402 with CEM. MATLAB® is available from the MathWorks, Inc., of Massachusetts, U.S.A.

FIG. 11 depicts exemplary MATLAB® code for computing the correction factors for the embodiment of delta-sigma modulator 402 depicted in FIGS. 9 and 10.

Figure 12:
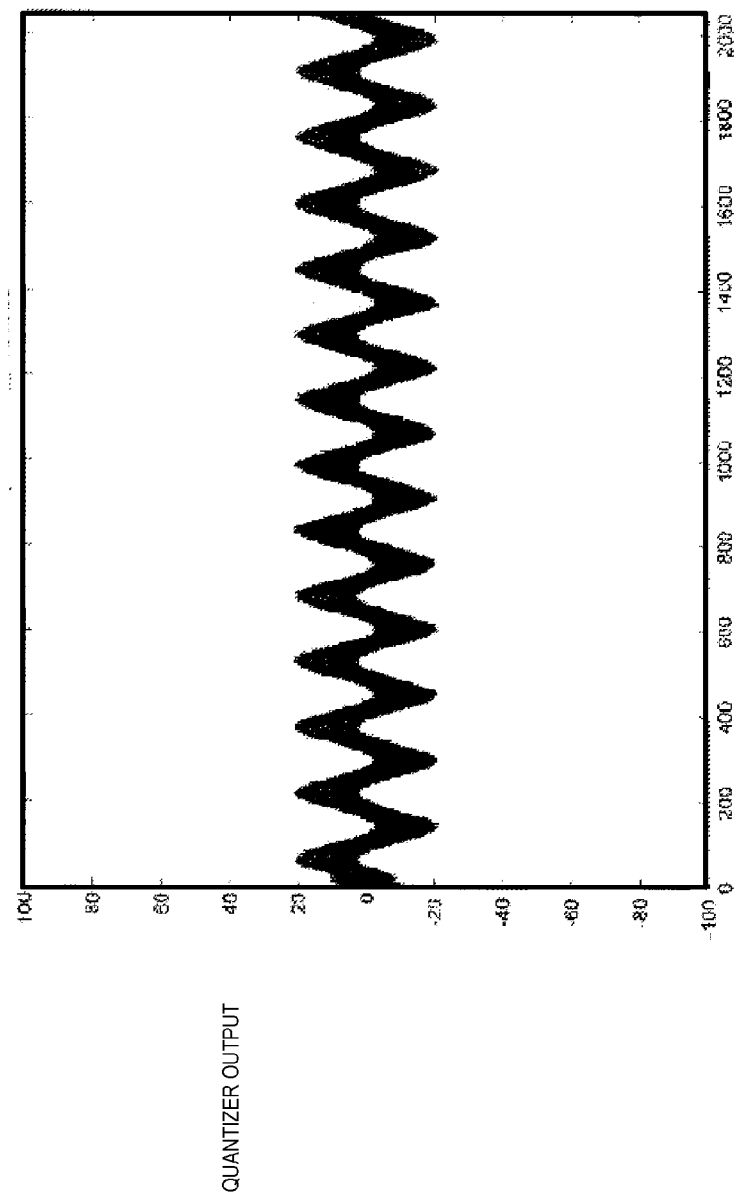
FIG. 12 depicts an exemplary time domain, sinusoidal quantizer output signal.

FIG. 12 depicts an exemplary time domain, sinusoidal output signal 1200 of quantizer 108 without adding output modification signal QOM(n) to the loop filter output signal LF(n). The sinusoidal output signal 1200 is typical of a low-level input signal x(n).

Figure 13:
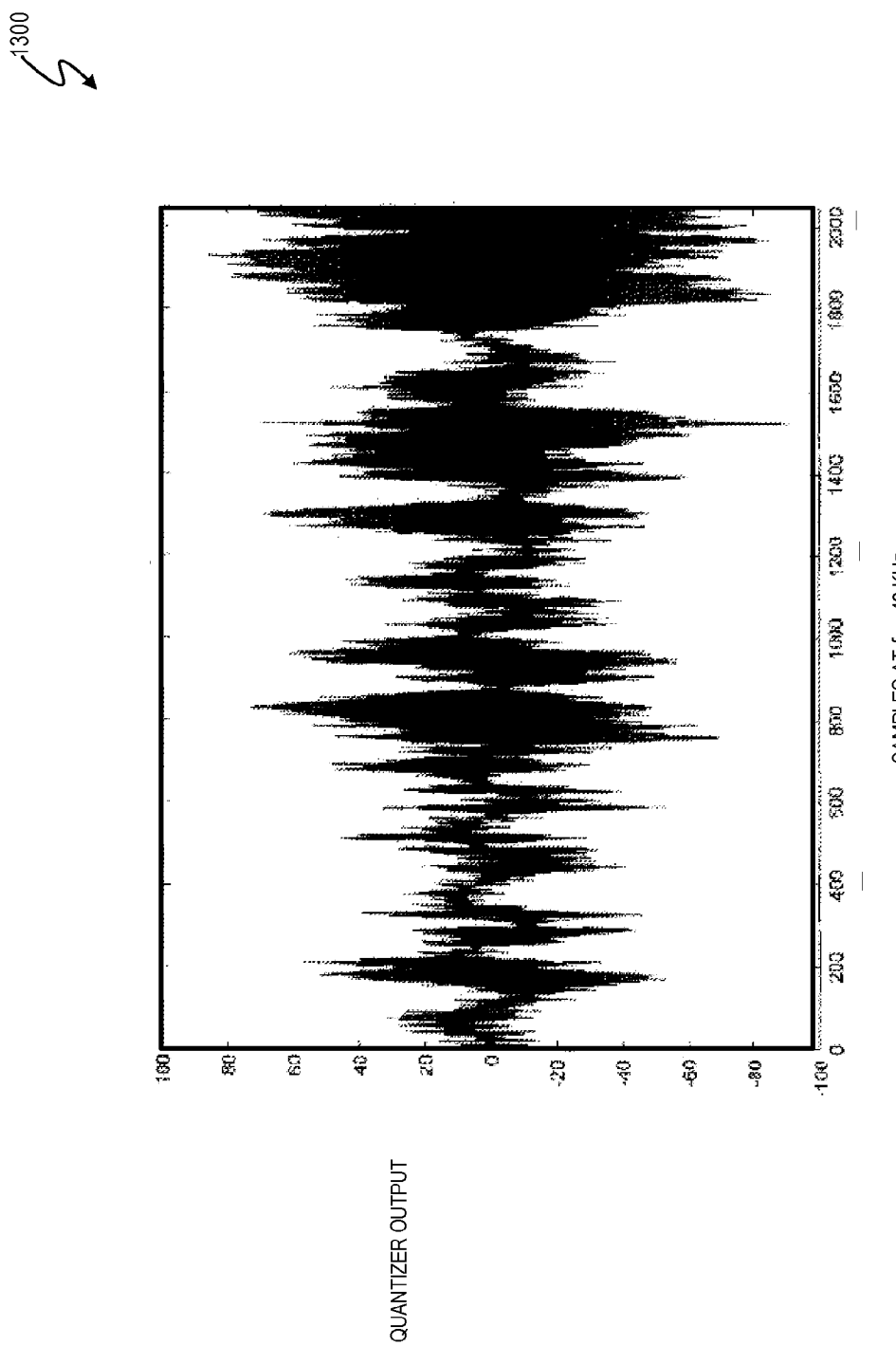
FIG. 13 depicts an exemplary time domain output of a quantizer with added random noise.

FIG. 13 depicts samples of an exemplary modified loop filter output signal LFM(n) 1300 of quantizer 408 with random noise added to the sinusoidal output signal 1200. In at least one embodiment, output modification signal QOM (n) represents the random noise component added to the sinusoidal output signal 1200. Thus, the difference between signals 1200 and 1300 indicates an exemplary level of noise added to the loop filter output signal LF(n). The random noise is added at the $f_{OS}/2$ rate, so baseband performance is unaffected.

Figure 14:
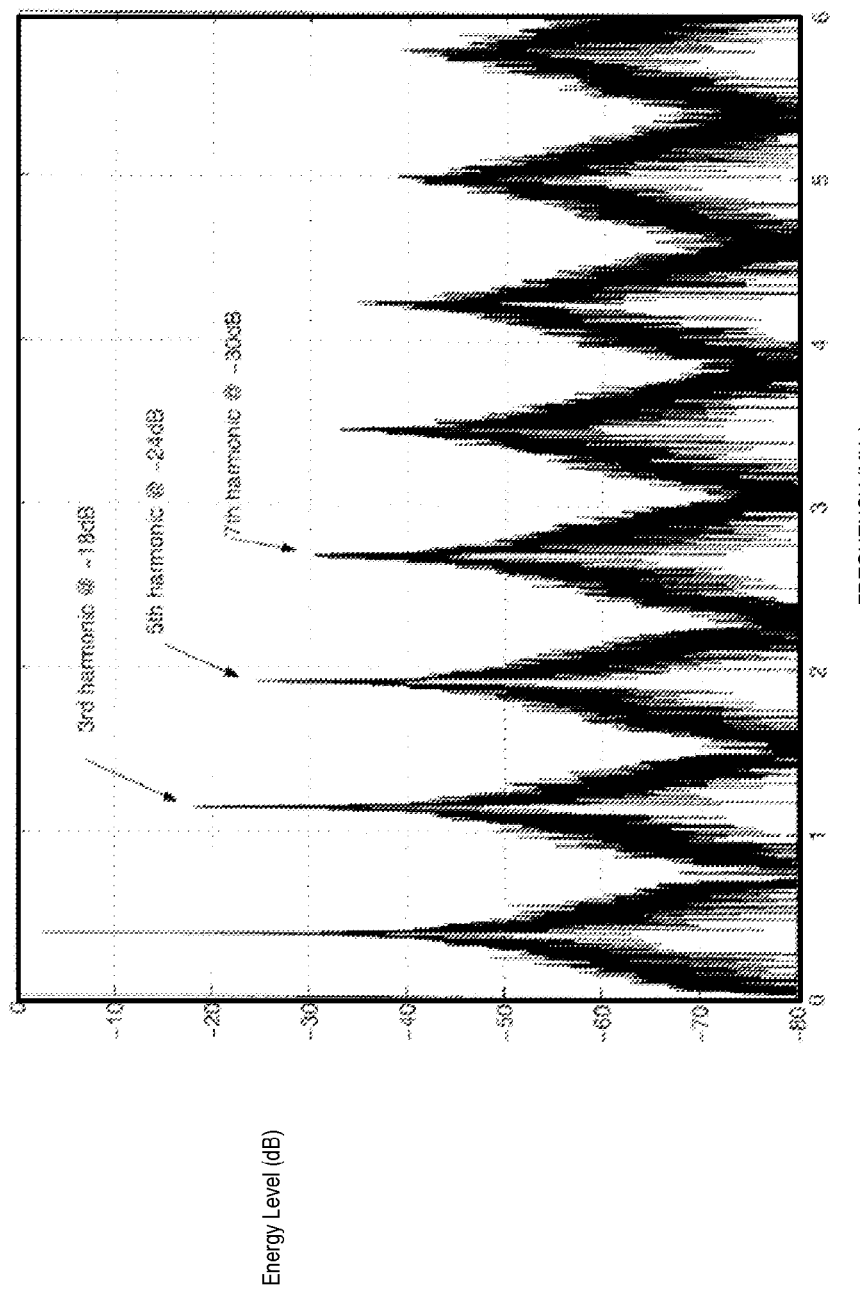
FIG. 14 depicts a frequency analysis of the signal processing system of FIG. 7 using a random noise loop filter modification signal and a 1 kHz low pass filter.

FIG. 14 depicts a frequency analysis 1400 of the PWM output signal y(n) for signal processing system 700. The output modification signal QOM(n) modifies the loop filter output signal LF(n) using random noise. The low pass filter 708 has a cut-off frequency of 1 kHz. Thus, the output modification signal QOM(n) is centered at $f_{OS}/2$ with a band limit of 1 kHz. The spectrum of harmonic frequencies of pulse width modulator output signal y(n) is spread out to decrease peak energy levels of PWM output signal y(n). Comparing the frequency analyses 300 and 1400, the signal processing system 700 spreads the spectrum of harmonic frequencies of the low level input signal x(n) and, thus, reduces peak energy levels by 6 dB, 8 dB, and 11 dB for the respective $3^{rd}$, $5^{th}$, and $7^{th}$ harmonic frequencies for a fundamental harmonic frequency of 384 kHz. With the peak energy levels reduced in the RF spectrum, signal processing system 700 also reduces EMI in, for example, power amplifier and servo applications.

Figure 15:
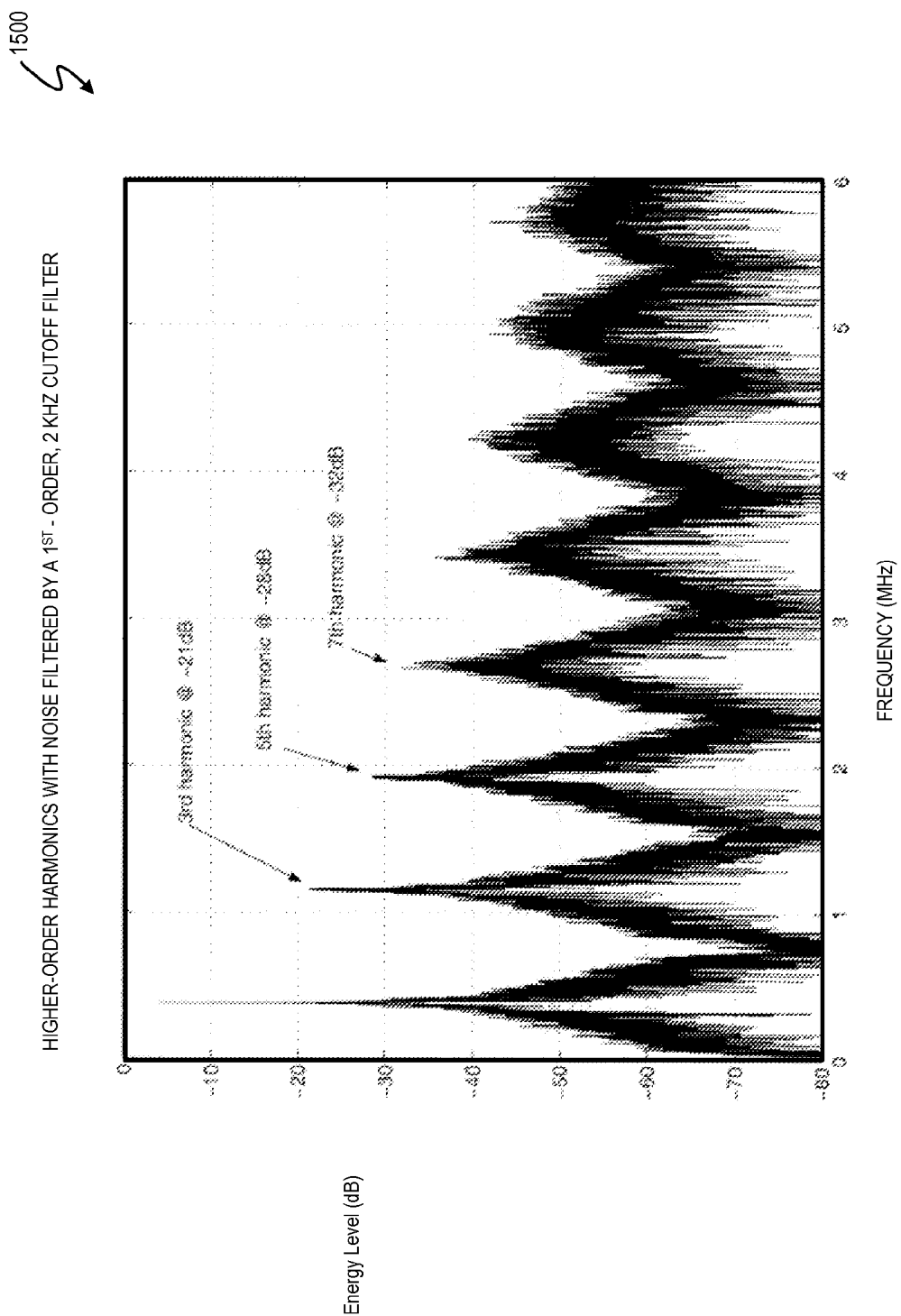
FIG. 15 depicts a frequency analysis of the signal processing system of FIG. 7 using a random noise loop filter modification signal and a 2 kHz low pass filter.

FIG. 15 depicts a frequency analysis 1500 of the PWM output signal y(n) in signal processing system 700 using the random noise version of output modification signal QOM(n) to modify the loop filter output signal LF(n) using random noise. The low pass filter 708 has a cut-off frequency of 2 kHz. Thus, the random noise signal is centered at $f_{OS}/2$ with a band limit of 2 kHz. The spectrum of harmonic frequencies of pulse width modulator output signal y(n) is spread out to decrease peak energy levels of PWM output signal y(n). Comparing the frequency analyses 300 and 1500, the signal processing system 700 spreads the spectrum of harmonic frequencies for the low level input signal x(n) and, thus, reduces peak energy levels by 9 dB, 12 dB, and 13 dB for the respective $3^{rd}$, $5^{th}$, and $7^{th}$ harmonic frequencies of a fundamental harmonic frequency of 384 kHz. With the peak energy levels reduced in the RF spectrum, signal processing system 700 also reduces EMI in, for example, power amplifier and servo applications.

Figure 16:
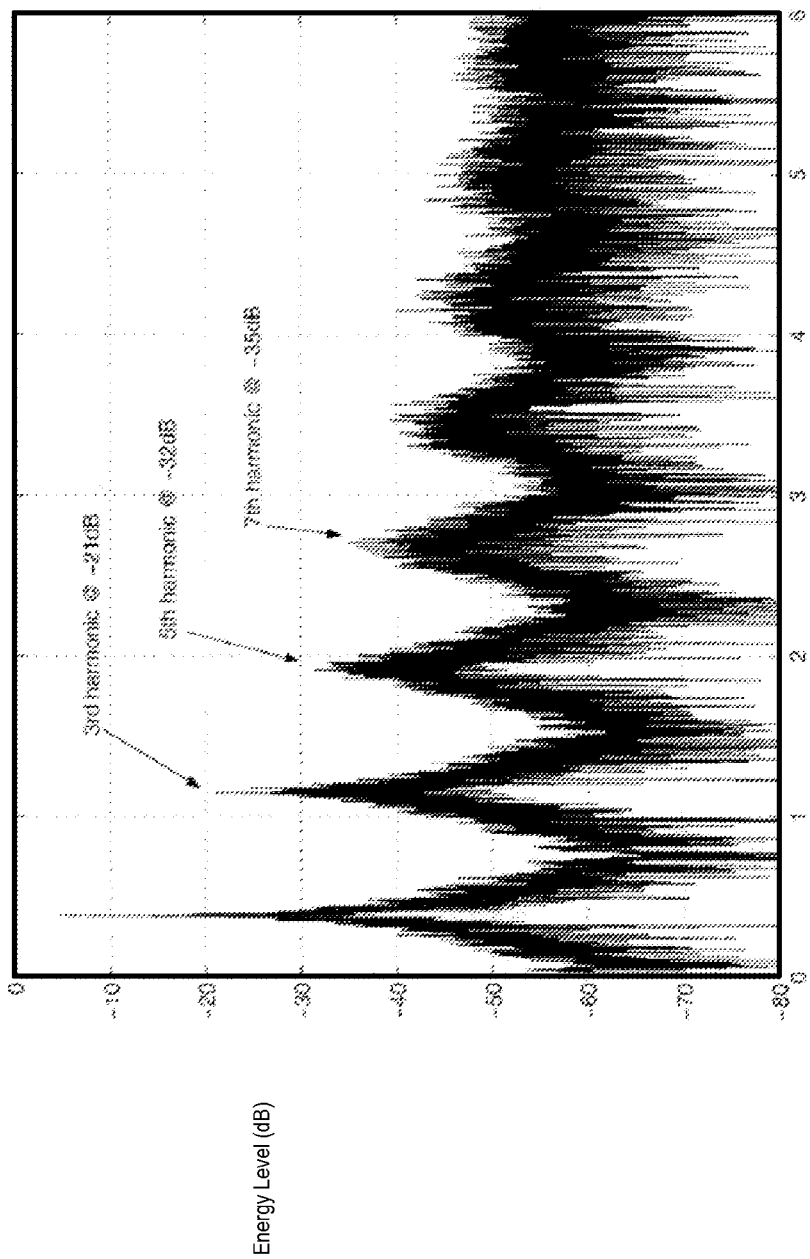
FIG. 16 depicts a frequency analysis of the signal processing system of FIG. 7 using a random noise loop filter modification signal and a 3 kHz low pass filter.

FIG. 16 depicts a frequency analysis 1600 of the PWM output signal y(n) in signal processing system 700 using the random noise version of output modification signal QOM(n) to modify the loop filter output signal LF(n) using random noise. The low pass filter 708 has a cut-off frequency of 3 kHz. Thus, the random noise signal is centered at $f_{OS}/2$ with a band limit of 3 kHz. The spectrum of harmonic frequencies of the pulse width modulator output signal y(n) is spread out to decrease peak energy levels of PWM output signal y(n). Comparing the frequency analyses 300 and 1600, the signal processing system 700 spreads the spectrum of harmonic frequencies for the low level input signal x(n) and, thus, reduces peak energy levels by 9 dB, 16 dB, and 16 dB for the respective $3^{rd}$, $5^{th}$, and $7^{th}$ harmonic frequencies of a fundamental harmonic frequency of 384 kHz. With the peak energy levels reduced in the RF spectrum, signal processing system 700 also reduces EMI in, for example, power amplifier and servo applications.

Modification of a loop filter output signal to spread the spectrum of harmonic frequencies in a PWM output signal also has applicability in a multi-channel signal processing system. In a multi-channel signal processing system, the signal processing system generates M pulse width modulator output signals $y_1(n)$, $y_2(n)$, ..., $y_M(n)$, where M represents the number channels. Commonly assigned U.S. patent application Ser. No. 10/767,906, filed Jan. 29, 2004 by inventors Johann Gaboriau, John Melanson, Lingli Zhang, and Melvin Hagge (referred to herein as the "Gaboriau Application") discloses an exemplary embodiment of a system and method that reduces cross-talk and related distortion and noise in multi-channel pulse width modulation systems. The Gaboriau Application is hereby incorporated by reference in its entirety.

In at least one embodiment, a multi-channel signal processing system includes M delta-sigma modulators/PWM combinations, where M is the number of channels. As discussed previously, in at least one embodiment, modifying quantizer output signal q(n) indirectly by modifying the loop filter output signal LF(n) or directly in another embodiment using output modification signal QOM(n) causes pulse duty cycles, and, thus, frame-to-frame pulse start and end times, to vary on a frame-by-frame basis. In a multi-channel system, the loop filter output signals or, in another embodiment, the quantizer output signals of each delta-sigma modulator can be individually modified to spread the spectrum of harmonic frequencies of each associated. In at least one embodiment, the multi-channel system is also configured to reduce inter-channel alignment in time of pulse edges of concurrently generated frames of PWM output signals $y_1(n)$, $y_2(n)$, ..., $y_M(n)$.

Many methods can be used to modify the quantizer output signal q(n) and spread the spectrum of harmonic frequencies. For example, independently generated signals $QOM_1(n)$, $QOM_2(n)$, ..., QOM M(n) can be added to the respective loop filter output signals LF(n) or, in another embodiment, added directly to the quantizer output signal q(n). In another embodiment, a random output modification signal QOM(n) is added to each loop filter output signal $LF_1(n)$, $LF_2(n)$, ..., $LF_M(n)$ or, in another embodiment, to each quantizer output signal q(n), so that the probability of rising edge alignment is small enough to spread the spectrum of harmonic frequencies and reduce EMI to within allowable levels. In another embodiment, an interlocking process provides feedback between channels so that the shift of pulse start and end times of PWM patterns in one channel is responsive to shifting of pulse start and end times in another channel, thus reducing inter-channel pulse edge alignment.

Figure 17:
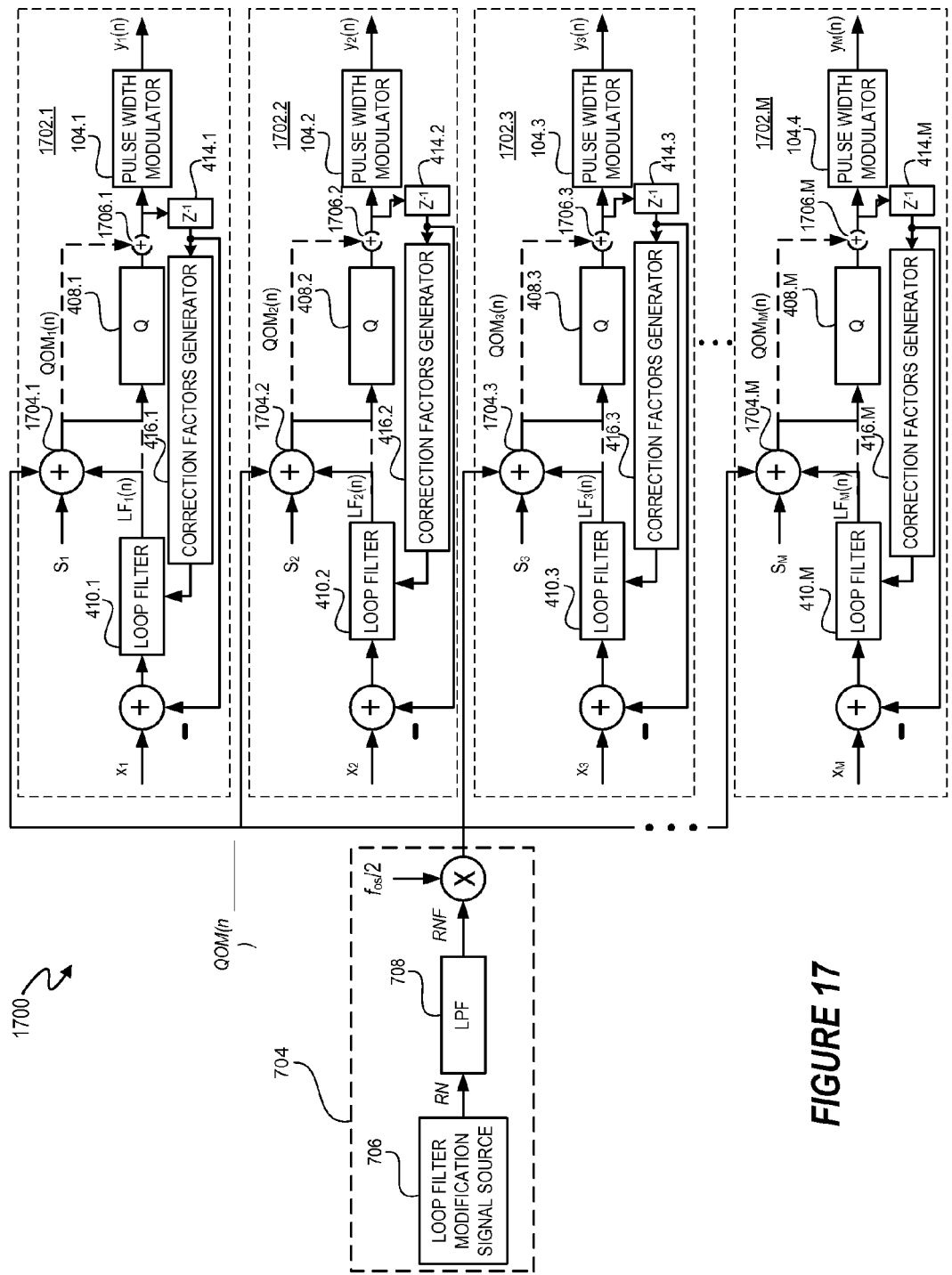
FIG. 17 depicts an M-channel signal processing system that shifts pulse edges of pulse width modulator output signals using a common and independent loop filter modification signals.

FIG. 17 depicts one embodiment of an M-channel signal processing system 1700 that shifts pulse edges of pulse width modulator output signals to spread the spectrums of harmonic frequencies of multi-channel output signals $y_1(n)$, $y_2(n)$, ..., $y_M(n)$, especially for low-level input signals $x_1(n)$, $x_2(n)$, ..., $x_M(n)$. Signal processing system 1700 collectively changes frame-to-frame duty cycles and frame-to-frame pulse start and end times of pulse width modulator output signals $y_1(n)$, $y_2(n)$, ..., $y_M(n)$ with output modification signal QOM(n) and individually with pulse start and end time shift signals $S_1$, $S_2$, $S_3$, ..., $S_M$ to spread the spectrum of harmonic frequencies of each channel. Signal processing system 1700 includes M CEM mode delta sigma modulators 1702.1, 1702.2, 1702.3, ... 1702.M. Shift signals $S_1$, $S_2$, $S_3$, and $S_M$ are provided as inputs to respective adders 1704.1, 1704.2, 1704.3, and 1704.M. Adders 1704.1, 1704.2, 1704.3, 11704.M add each of shift signals $S_1$, $S_2$, $S_3$, ..., $S_M$ to output modification signal QOM(n). In at least one embodiment, modification of each quantizer output signal q(n) by modifying the loop filter output signals $LF_1(n)$, $LF_2(n)$, $LF_3(n)$, ..., $LF_M(n)$ by the addition of shift signals $S_1$, $S_2$, $S_3$, ..., $S_M$ to output modification signals $QOM_1(n)$, $QOM_2(n)$, $QOM_3(n)$, ..., $QOM_M(n)$ spread the spectrum of harmonic frequencies from an intra-channel and inter-channel perspective of PWM output signals $y_1(n)$, $y_2(n)$, ..., $y_M(n)$. In another embodiment, indicated by the dashed lines exiting adders 1704.1, 1704.2, 1704.3, ..., 1704.M and loop filters 410.1, 410.2, 410.3, ..., 410.M, adders 1706.1, 1706.2, 1706.3, ..., 1706.M modify each quantizer output signal for each channel by adding in the output modification signals $QOM_1(n)$, $QOM_2(n)$, $QOM_3(n)$, ..., $QOM_M(n)$ to spread the spectrum of harmonic frequencies from an intra-channel and inter-channel perspective of PWM output signals $y_1(n)$, $y_2(n)$, ..., $y_M(n)$.

Figure 18:
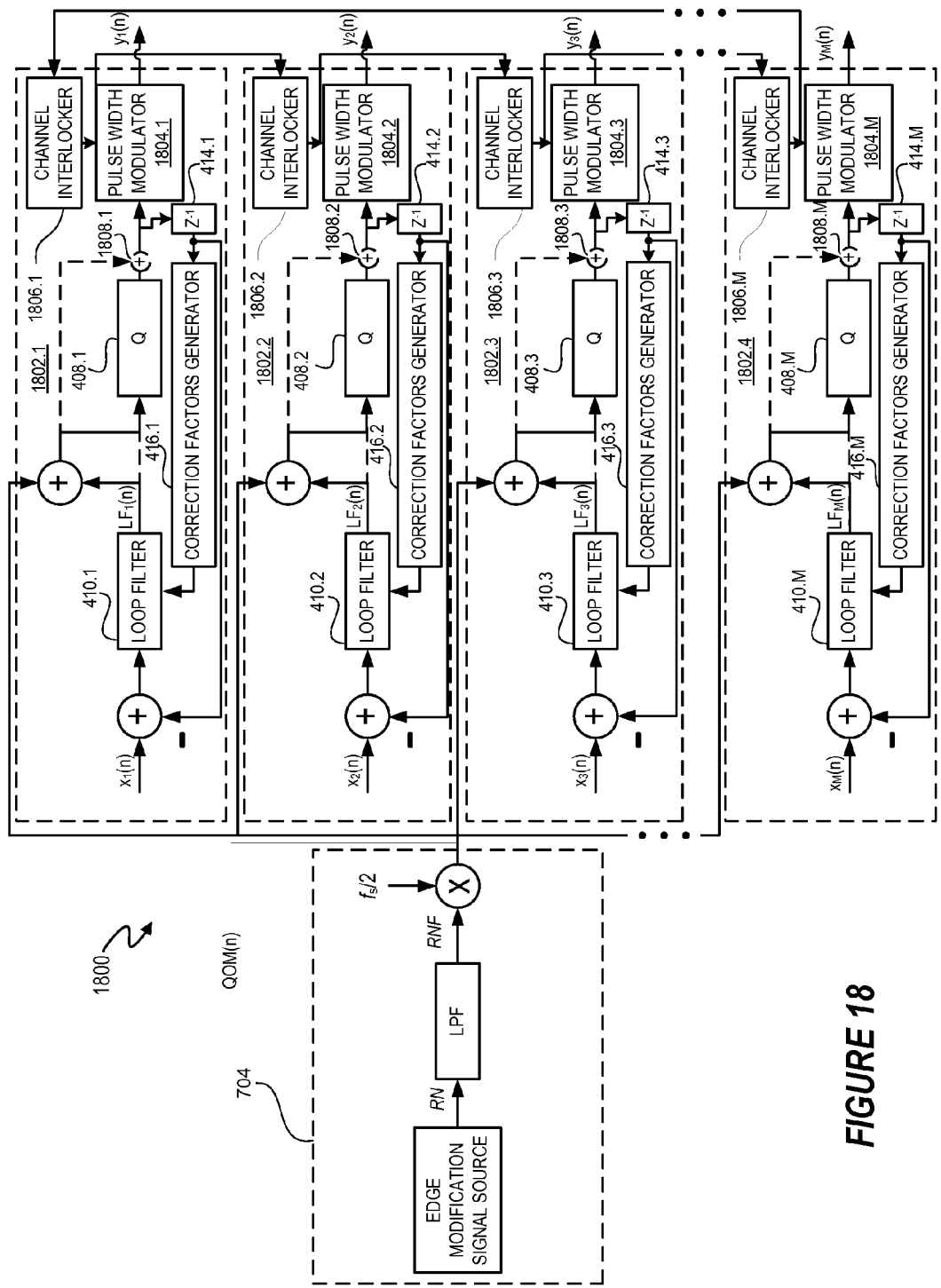
FIG. 18 depicts an M channel signal processing system that utilizes an interlocking procedure to shift pulse edges of pulse width modulator output signals.

FIG. 18 depicts an M channel signal processing system 1800 that utilizes an interlocking procedure to shift pulse edges of pulse width modulator output signals to spread the spectrum of intra-channel and inter-channel harmonic frequencies of multi-channel output signals $y_1(n)$, $y_2(n)$, ..., $y_M(n)$. In at least one embodiment, output modification signal QOM(n) is added to modify each of the loop filter output signals $LF_1(n)$, LF2($n$), ..., $LF_M(n)$, which modifies the quantizer output signal of each channel. In at least one embodiment, individual signals, such as $S_1$, $S_2$, $S_3$, ..., $S_M$, of FIG. 17, can also be used to modify loop filter output signals $LF_1(n)$, LF2($n$), ..., $LF_M(n)$. In another embodiment, indicated by the dashed lines exiting loop filters 410.1, 410.2, 410.3, ..., 410.M, adders 1808.1, 1808.2, 1808.3, ..., 1808.M directly add the output modification signal QOM(n) to the quantizer output signal of each channel.

In a multi-channel signal processing system, the signal processing system generates M pulse width modulator output signals $y_1(n)$, $y_2(n)$, ..., $y_M(n)$, where M represents the number channels. Each pulse width modulator 1802.1, 1802.2, ..., 1802.M includes a respective channel interlocker 1806.1, 1806.2, ..., 1806.M. PWM patterns are modified sequentially for each channel by respective channel interlockers 1804.1, 1804.2, ..., 1804.M. Thus, in at least one embodiment, the pulse width modulators 1804,1, 1804.2, ..., 1804.M generate respective PWM patterns in accordance with pulse edge shifting input data from respective channel interlockers 1806.1, 1806.2, . . . , 1806.M.

PWM pattern generation for a channel is responsive to the immediately preceding PWM pattern generation by another channel interlocker. For example, channel interlocker 1804.1 generates pulse edge shifting data, then channel interlocker 1804.2 generates pulse edge shifting data, and so on until channel interlocker 1804.M selects a PWM pattern. Once each channel interlocker generates pulse edge shifting data for a PWM pattern, the generation of pulse edge shifting data repeats. The channel interlockers 1806.1, 1806.2, . . . , 1806.M are sequentially coupled together so that generation of pulse edge shifting data by channel interlocker 1804.*i* is responsive to the preceding PWM pattern selection by channel interlocker 1804.*i*–1, i∈{1, 2, . . . , M}. Thus, in at least one embodiment, each of channel interlockers 1804.1, 1804.2, . . . , 1804*m* generate pulse edge shifting data that shifts the pulse start and end times of respective PWM output signals $y_1, y_2, \ldots, y_m$ based upon pulse start and end times in a corresponding-in-time frame of the immediately preceding channel. The interlocking process loops so the generation of pulse edge shifting data by channel interlocker 1804.1 is responsive to the generation of pulse edge shifting data of channel interlocker 1804.M after the first round of PWM pattern generations.

Figure 19:
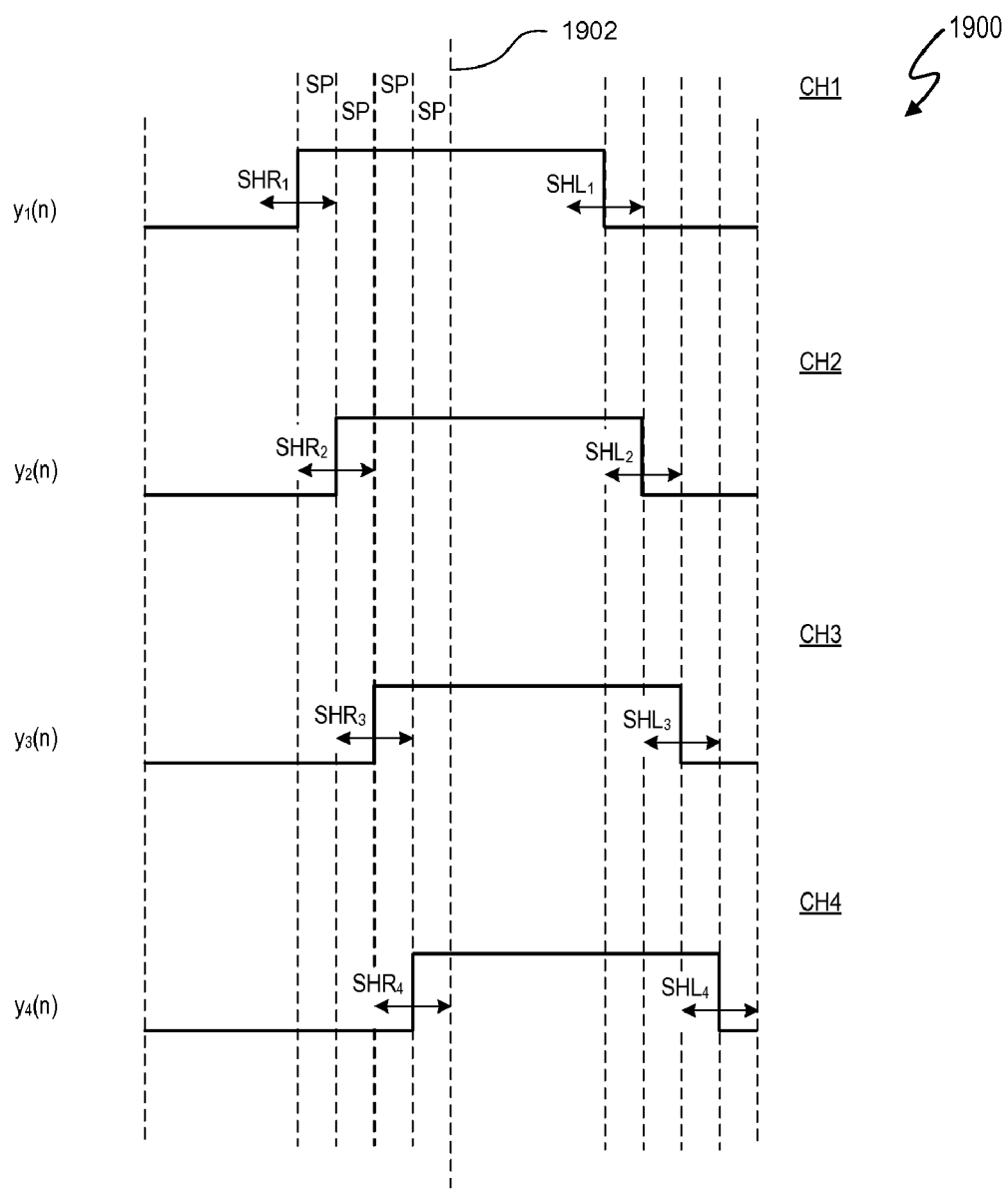
FIG. 19 depicts an exemplary time-domain, multi-frame representation of a four multi-channel output signals.

FIG. 19 depicts an exemplary time-domain, multi-frame representation of multi-channel output signals $y_1(n)$, $y_2(n)$, $y_3(n)$, and $y_4(n)$ (M=4). Referring to FIGS. 18 and 19, pulses of channels CH1, CH2, CH3, and CH4 corresponding-in-time and have a large number of available shifting options (delaying and advancing) to prevent non-overlap of rising and falling edges. The line 1902 indicates the separate determination of pulse start and end times in CEM mode. Preferably, the pulse start and end times in each frame are shifted by the same amount so as not to change the pulse widths.

In the interlocking procedure undertaken by the channel interlockers 1806.1, 1806.2, . . . , 1806.M, the pulse rising edge of each PWM pattern has a nominal spacing in time of +/−SP between pulse rising edges of PWM patterns of adjacent channels. PWM patterns associated with a single quantization level have pulse start times that shift in time from frame-to-frame by a factor of SH. In CEM mode, SHR indicates a shift in the pulse start time, and SHL indicates a shift in the pulse end time. When the pulse widths are maintained during shifting, SHR=SHL=SH. In at least one embodiment, SH is greater than one time quanta of a PWM output signal $y(n)$ frame In at least one embodiment, one time quanta represents one time slot in PWM output signal $y(n)$, which equals the amount of time for a pulse edge to rise or fall. Generation of the PWM patterns for each channel to achieve intra-channel and inter-channel spreading of the spectrum of harmonic frequencies is a function of the spacing S and the shift SH. In at least one embodiment, the shift options are from $-SH_i$ to $+SH_i$, and $-SH_i=SH_p-(SP-1)$ and $+SH_i=SP$, where "$-SH_i$" refers to an advance of the pulse rising edge, i.e. a shift to the left of the pulse start time, and "+SH" refers to a delay of the pulse rising edge, i.e. a shift to the right of the pulse end time. "i" refers to the particular channel and "p" refers to the previous channel. In CEM mode, the falling edges of each pulse are determined separately from the rising edges. However, in at least one embodiment, the pulse start and end times are shifted together so as to maintain the pulse width.

Table 2 represents an exemplary determination of selected shift data for each of channels CH1, CH2, CH3, and CH4. The nominal spacing between each channel is a delay SP=+8. The channel interlockers 1804.1, 1804.2, . . . , 1804.M generate shift data to shift the rising and falling edges of the PWM patterns for each channel within the range of $-SH_i$ and $+SH_i$ from Table 2. The Shift Data represents the shift of the pulse start and end times of the selected PWM pattern in relation to the pulse start and end times of the generated PWM pattern of the immediately preceding shifted channel. The Shift Data in Table 2 also represents $SH_p$ for the next channel to be processed.

TABLE 2

| Channel | $-SH_i$ | $+SH_i$ | Shift Data |
|---|---|---|---|
| 1 | −7 | +8 | 0 |
| 2 | −7 | +8 | +3 |
| 3 | −4 | +8 | +4 |
| 4 | −3 | +8 | −1 |
| 1 | −8 | +8 | −2 |
| 2 | −9 | +8 | +5 |
| 3 | −2 | +8 | +1 |
| 4 | −6 | +8 | −4 |

Figure 20:
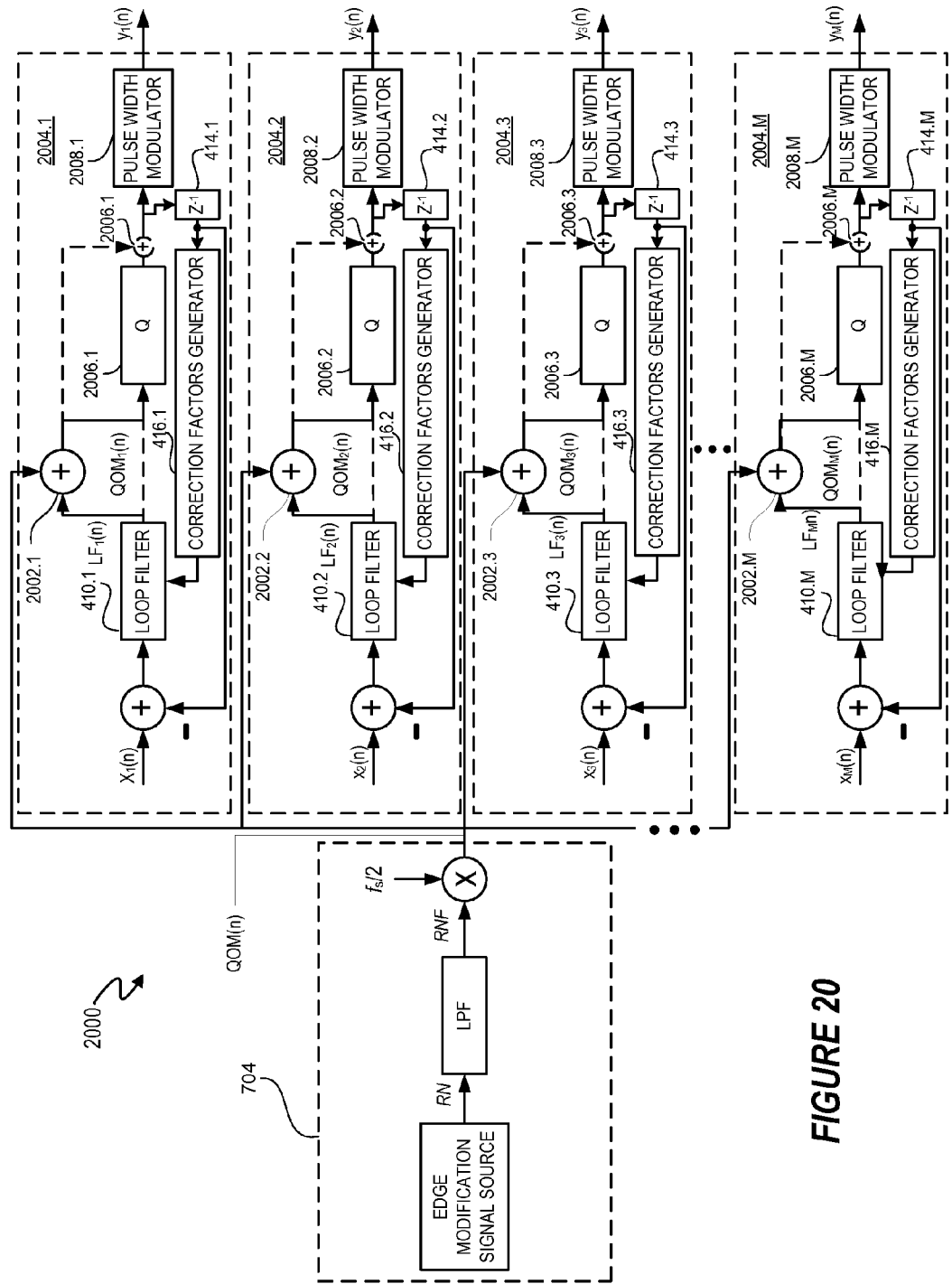
FIG. 20 depicts one embodiment of an M-channel signal processing system that shifts pulse edges of pulse width modulator output signals using a common loop filter modification signal.

FIG. 20 depicts an M-channel signal processing system 2000 that functions identically to multi-channel signal processing system 1700 except that the output modification signal QOM(n) is not combined with shift signals $S_1, S_2, S_3$, and $S_M$ to modify the loop filter output signals $LF_1(n)$, $LF_2(n), \ldots, LF_M(n)$. In at least one embodiment, output modification signal QOM(n) is the random noise signal indicated in FIG. 13. In at least one embodiment, delta sigma modulator input signals $x_1(n), x_2(n), \ldots, x_M(n)$ are independent, so output modification signal QOM(n) shifts intra-channel pulse edges to spread the spectrum of harmonic frequencies, and the independence of input signals $x_1(n), x_2(n), \ldots, x_M(n)$ and the addition of output modification signal QOM(n) reduce the probability of inter-channel pulse edge alignment in time, and thus, spread the spectrum of harmonic frequencies of the PWM output signals $y_1, y_2, \ldots, y_M$ of signal processing system 2000.

The output modifier 704 modulates filtered noise signal RNF to half the oversampling frequency, $f_{OS}/2$. In at least one embodiment, adders 2002.1, 2002.2, 2002.3, . . . , 2002.M of respective delta sigma modulators 2004.1, 2004.2, 2004.3, 2004.M adds the output modification signal QOM(n) to respectively modify each of respective loop filter output signals $LF_1(n), LF_2(n), LF_3(n), \ldots, LF_M(n)$ to generate respective quantizer input signals $QOM_1(n)$, $QOM_2(n) QOM_3(n), \ldots, QOM_M(n)$. The quantizers 2006.1, 2006.2, 2006.3, . . . , 2006.M generate respective quantizer output signals. In at least one other embodiment indicated by the dashed lines exiting adders 2002.1, 2002.2, 2002.3, . . . , 2002.M and loop filters 410.1, 410.2, 410.3, . . . , 410.M, output modification signal QOM(n) is added directly to each of the quantizer output signals for each of the channels.

The common output modification signal QOM(n) effectively modifies all quantizer output signals, which in turn modifies all output signals $y_1(n), y_2(n), y_3(n), \ldots, y_M(n)$ of respective pulse width modulators 2008.1, 2008.2, 2008.3, . . . , 2008.M, to randomly shift the pulse edges in successive frames of output signals $y_1(n), y_2(n), y_3(n), \ldots, y_M(n)$. Randomly shifting the pulse edges spreads the spectrum of harmonic frequencies in each of the respective independent output signals $y_1(n), y_2(n), y_3(n), y_M(n)$. Additionally, by making the shifts large, the pulse edges in concurrent channels will have reduced overlap, thus, better spreading the spectrum of harmonic frequencies.

Although the present invention has been described in detail, it should be understood that various changes, substitutions and alterations can be made hereto without departing from the spirit and scope of the invention as defined by the appended claims. For example, in at least one embodiment multiplexing techniques can be used to reduce the number of instantiations of delta sigma modulators and/or the pulse width modulators to less than the number channels. In at least one embodiment, the multiplexing techniques include storing and retrieving state variables on a rotating basis to generate a respective PWM output signal for each channel.

What is claimed is:

1. A method comprising:
  receiving a set of delta sigma modulator input samples;
  generating delta sigma modulator loop filter output samples in response to receiving the delta sigma modulator input samples;
  generating delta sigma modulator quantizer output samples;
  modifying the quantizer output samples with a modification signal to generate modified quantizer output samples; and
  modulating the modified quantizer output samples to generate pulses in a pulse width modulator output signal, wherein each pulse has a pulse start time and a pulse end time relative to a beginning of a respective frame of the pulse width modulator output signal and the modification signal causes pulse start times and pulse end times of the pulses to differ sufficiently from pulse start times and pulse end times of unmodified quantizer output samples to reduce energy levels of at least the $3^{rd}$ and $5^{th}$ harmonic frequencies of the pulse width modulator output signal by at least 3 dB relative to energy levels of the $3^{rd}$ and $5^{th}$ harmonic frequencies of a pulse width modulated output signal generated with unmodified quantizer output samples.

2. The method of claim 1 wherein:
  modifying the quantizer output samples with a modification signal to generate modified quantizer output samples further comprises
    modifying the loop filter output samples with a modification signal to generate modified loop filter output samples; and
  generating delta sigma modulator quantizer output samples further comprises:
    quantizing the modified loop filter output samples to generate delta sigma modulator quantizer output samples.

3. The method of claim 1 wherein the modification signal causes frame-to-frame duty cycles of the pulses to change.

4. The method of claim 1 wherein duty cycles of the frames corresponding to the modified loop filter output samples vary from frame-to-frame.

5. The method of claim 1 further comprising:
  generating a pre-modification output signal;
  low pass filtering the pre-modification signal; and
  modulating the pre-modification signal up to a modulation frequency to generate the modification signal.

6. The method of claim 5 wherein generating the pre-modification output signal comprises:
  generating a random noise signal, wherein the pre-modification output signal is the random signal.

7. The method of claim 5 wherein modulating the pre-modification signal up to a modulation frequency to generate the modification signal comprises:
  modulating the pre-modification signal up to one-half of an operating frequency of the delta sigma modulator.

8. The method of claim 5 wherein low pass filtering the pre-modification signal comprises:
  low pass filtering the pre-modification signal using a low pass filter having a cut-off frequency in the range of 1 kHz to 3 kHz.

9. The method of claim 1 wherein each frame has a period equal to time T, and the pulse start times of pulses in sequential frames differ by at least T/3 for low-level input signals.

10. The method of claim 1 further comprising:
  generating correction factors to correct for non-linearities in the pulse width modulator output signal; and
  providing the correction factors to at least one integrator of a delta sigma modulator loop filter that generates the delta sigma modulator loop filter output samples.

11. The method of claim 1 wherein modifying the loop filter output samples with a modification signal to generate modified loop filter output samples comprises:
  multiplying each loop filter output sample by a sample of the modification signal.

12. The method of claim 1 further comprising:
  spreading a spectrum of harmonic frequencies in pulse width modulator output signals for N channels, wherein N is an integer greater than one.

13. The method of claim 12 wherein spreading a spectrum of harmonic frequencies in pulse width modulator output signals for N channels comprises:
  receiving N−1 additional sets of delta sigma modulator input samples, wherein each of the N sets of multiple delta sigma modulator input samples represents delta sigma modulator input data samples associated with one of the N channels;
  for each channel, generating delta sigma modulator loop filter output samples in response to receiving the delta sigma modulator input samples associated with the channel;
  modifying the loop filter output samples of each of the N channels with the modification signal to generate modified loop filter output samples for each of the N channels;
  quantizing the modified loop filter output samples of each of the N channels to generate delta sigma modulator quantizer output samples for each of the N channels; and
  modulating the quantizer output samples to generate pulses in pulse width modulator output signals for each of the N channels, wherein, for each pulse width modulator output signal, each pulse has a pulse start time and a pulse end time relative to a beginning of a respective frame of the pulse width modulator output signal and the modification signal causes the pulse start times and pulse end times of the pulses to differ sufficiently from pulse start times and pulse end times of unmodified quantizer output samples to reduce energy levels of at least the $3^{rd}$ and $5^{th}$ harmonic frequencies of the pulse width modulator output signal by at least 3 dB relative to energy levels of the $3^{rd}$ and $5^{th}$ harmonic frequencies of collective pulse width modulated output signals generated with unmodified loop filter output samples.

14. The method of claim 12 wherein spreading a spectrum of harmonic frequencies in pulse width modulator output signals for N channels comprises:
  receiving N−1 additional sets of delta sigma modulator input samples, wherein each of the N sets of multiple delta sigma modulator input samples represents delta sigma modulator input data samples associated with one of the N channels;

for each channel, generating delta sigma modulator loop filter output samples in response to receiving the delta sigma modulator input samples associated with the channel;

for each of the N channels, modifying the loop filter output samples with the modification signal and with a second modification signal $S_i$ to generate modified loop filter output samples for each of the N channels, wherein $i \in \{1, 2, \ldots, N\}$ and $S_x \neq S_y$ for $x \in \{1, 2, \ldots, N\}$ and $y \in \{1, 2, \ldots N\}$;

quantizing the modified loop filter output samples of each of the N channels to generate delta sigma modulator quantizer output samples for each of the N channels; and modulating the quantizer output samples to generate pulses in pulse width modulator output signals for each of the N channels, wherein, for each pulse width modulator output signal, each pulse has a pulse start time and a pulse end time relative to a beginning of a respective frame of the pulse width modulator output signal and the modification signal causes the pulse start times and pulse end times of the pulses to differ sufficiently from pulse start times and pulse end times of unmodified quantizer output samples to reduce energy levels of at least the $3^{rd}$ and $5^{th}$ harmonic frequencies of the pulse width modulator output signal by at least 3 dB relative to energy levels of the $3^{rd}$ and $5^{th}$ harmonic frequencies of collective pulse width modulated output signals generated with unmodified loop filter output samples.

15. The method of claim 12 wherein spreading a spectrum of harmonic frequencies in pulse width modulator output signals for N channels comprises:

receiving N−1 additional sets of delta sigma modulator input samples, wherein each of the N sets of multiple delta sigma modulator input samples represents delta sigma modulator input data samples associated with one of the N channels;

for each channel, generating delta sigma modulator loop filter output samples in response to receiving the delta sigma modulator input samples associated with the channel;

modifying the loop filter output samples of each of the N channels with the modification signal to generate modified loop filter output samples for each of the N channels;

quantizing the modified loop filter output samples of each of the N channels to generate delta sigma modulator quantizer output samples for each of the N channels;

modulating the quantizer output samples to generate pulses for pulse width modulator output signals for each of the N channels, wherein, for each pulse width modulator output signal, each pulse has a pulse start time and a pulse end time relative to a beginning of a respective frame of the pulse width modulator output signal;

modifying the pulse start times and pulse end times for one channel in response to previously determined pulse start times and pulse end times of another channel if the pulse start times and pulse end times occur concurrently, wherein the modification signal and subsequent modification of the pulse start times and pulse end times of the pulses to differ sufficiently from pulse start times and pulse end times of unmodified quantizer output samples to reduce energy levels of at least the $3^{rd}$ and $5^{th}$ harmonic frequencies of the pulse width modulator output signal by at least 3 dB relative to energy levels of the $3^{rd}$ and $5^{th}$ harmonic frequencies of collective pulse width modulated output signals generated with unmodified loop filter output samples.

16. A method comprising:

receiving a set of delta sigma modulator input samples;

generating delta sigma modulator loop filter output samples in response to receiving the delta sigma modulator input samples;

generating a pre-modification output signal;

low pass filtering the pre-modification signal;

modulating the pre-modification signal up to a modulation frequency to generate the modification signal;

generating delta sigma modulator quantizer output samples;

modifying the quantizer output samples with the modification signal to generate modified quantizer output samples; and modulating the quantizer output samples to generate pulses in a pulse width modulator output signal.

17. The method of claim 16 wherein:

modifying the quantizer output samples with the modification signal to generate modified quantizer output samples further comprises:

modifying the loop filter output samples with the modification signal to generate modified loop filter output samples; and generating delta sigma modulator quantizer output samples further comprises:

quantizing the modified loop filter output samples to generate delta sigma modulator quantizer output samples.

18. The method of claim 16 wherein each pulse has a pulse start time and a pulse end time relative to a beginning of a respective frame of the pulse width modulator output signal and the modification signal causes pulse start times and pulse end times of the pulses to differ sufficiently from pulse start times and pulse end times of unmodified quantizer output samples to reduce energy levels of at least the $3^{rd}$ and $5^{th}$ harmonic frequencies of the pulse width modulator output signal by at least 3 dB relative to energy levels of the $3^{rd}$ and $5^{th}$ harmonic frequencies of a pulse width modulated output signal generated with unmodified quantizer output samples.

19. The method of claim 18 wherein each frame has a period equal to time T, and the pulse start times of pulses in sequential frames differ by at least T/3 for low-level input signals.

20. The method of claim 16 wherein generating the pre-modification output signal comprises:

generating a random noise signal, wherein the pre-modification output signal is the random noise signal.

21. The method of claim 16 wherein modulating the pre-modification signal up to a modulation frequency to generate the modification signal comprises:

modulating the pre-modification signal up to one-half of an operating frequency of the delta sigma modulator.

22. The method of claim 16 wherein low pass filtering the pre-modification signal comprises:

low pass filtering the pre-modification signal using a low pass filter having a cut-off frequency in the range of 1 kHz to 3 kHz.

23. The method of claim 16 further comprising:

generating correction factors to correct for non-linearities in the pulse width modulator output signal; and providing the correction factors to at least one integrator of a delta sigma modulator loop filter that generates the delta sigma modulator loop filter output samples, wherein the correction factors provide correction for non-linearities in the pulse width modulated output signal.

24. The method of claim 16 wherein modifying the loop filter output samples with a modification signal to generate modified loop filter output samples comprises:
  multiplying each loop filter output sample by a sample of the modification signal.

25. The method of claim 16 further comprising:
  spreading a spectrum of harmonic frequencies in pulse width modulator output signals for N channels, wherein N is an integer greater than one.

26. The method of claim 25 wherein spreading a spectrum of harmonic frequencies in pulse width modulator output signals for N channels comprises:
  receiving N−1 additional sets of delta sigma modulator input samples, wherein each of the N sets of multiple delta sigma modulator input samples represents delta sigma modulator input data samples associated with one of the N channels;
  for each channel, generating delta sigma modulator loop filter output samples in response to receiving the delta sigma modulator input samples associated with the channel;
  modifying the loop filter output samples of each of the N channels with the modification signal to generate modified loop filter output samples for each of the N channels;
  quantizing the modified loop filter output samples of each of the N channels to generate delta sigma modulator quantizer output samples for each of the N channels; and
  modulating the quantizer output samples to generate pulses in pulse width modulator output signals for each of the N channels, wherein, for each pulse width modulator output signal, each pulse has a pulse start time and a pulse end time relative to a beginning of a respective frame of the pulse width modulator output signal and the modification signal causes the pulse start times and pulse end times of the pulses to differ sufficiently from pulse start times and pulse end times of unmodified quantizer output samples to reduce collective energy levels for all N channels for at least the $3^{rd}$ and $5^{th}$ harmonic frequencies of the pulse width modulator output signals by at least 3 dB relative to energy levels of the $3^{rd}$ and $5^{th}$ harmonic frequencies of collective pulse width modulated output signals generated with unmodified loop filter output samples.

27. The method of claim 25 wherein spreading a spectrum of harmonic frequencies in pulse width modulator output signals for N channels comprises:
  receiving N−1 additional sets of delta sigma modulator input samples, wherein each of the N sets of multiple delta sigma modulator input samples represents delta sigma modulator input data samples associated with one of the N channels;
  for each channel, generating delta sigma modulator loop filter output samples in response to receiving the delta sigma modulator input samples associated with the channel;
  for each of the N channels, modifying the loop filter output samples with the modification signal and with a second modification signal $S_i$ to generate modified loop filter output samples for each of the N channels, wherein i ∈ {1, 2, . . . , N} and $S_x \neq S_y$ for x ∈ {1, 2, . . . , N} and y ∈ {1, 2, . . . , N};
  quantizing the modified loop filter output samples of each of the N channels to generate delta sigma modulator quantizer output samples for each of the N channels; and
  modulating the quantizer output samples to generate pulses in pulse width modulator output signals for each of the N channels, wherein, for each pulse width modulator output signal, each pulse has a pulse start time and a pulse end time relative to a beginning of a respective frame of the pulse width modulator output signal and the modification signal and second modification signal cause the pulse start times and pulse end times of the pulses to differ sufficiently from pulse start times and pulse end times of unmodified quantizer output samples to reduce collective energy levels for all N channels for at least the $3^{rd}$ and $5^{th}$ harmonic frequencies of the pulse width modulator output signals by at least 3 dB relative to energy levels of the $3^{rd}$ and $5^{th}$ harmonic frequencies of collective pulse width modulated output signals generated with unmodified loop filter output samples.

28. The method of claim 25 wherein spreading a spectrum of harmonic frequencies in pulse width modulator output signals for N channels comprises:
  receiving N−1 additional sets of delta sigma modulator input samples, wherein each of the N sets of multiple delta sigma modulator input samples represents delta sigma modulator input data samples associated with one of the N channels;
  for each channel, generating delta sigma modulator loop filter output samples in response to receiving the delta sigma modulator input samples associated with the channel;
  modifying the loop filter output samples of each of the N channels with the modification signal to generate modified loop filter output samples for each of the N channels;
  quantizing the modified loop filter output samples of each of the N channels to generate delta sigma modulator quantizer output samples for each of the N channels;
  modulating the quantizer output samples to generate pulses for pulse width modulator output signals for each of the N channels, wherein, for each pulse width modulator output signal, each pulse has a pulse start time and a pulse end time relative to a beginning of a respective frame of the pulse width modulator output signal; and
  modifying the pulse start times and pulse end times for one channel in response to previously determined pulse start times and pulse end times of another channel if the pulse start times and pulse end times occur concurrently, wherein the modification signal and subsequent modification of the pulse start times and pulse end times causes the pulse start times and pulse end times of the pulses to differ sufficiently from pulse start times and pulse end times of unmodified quantizer output samples to reduce collective energy levels for all N channels for at least the $3^{rd}$ and $5^{th}$ harmonic frequencies of the pulse width modulator output signals by at least 3 dB relative to energy levels of the $3^{rd}$ and $5^{th}$ harmonic frequencies of collective pulse width modulated output signals generated with unmodified loop filter output samples.

29. A signal processing system comprising:
a delta sigma modulator having:
an input to receive a set of delta sigma modulator input samples;
a loop filter, coupled to the input, to generate delta sigma modulator loop filter output samples in response to receiving the delta sigma modulator input samples;
a quantizer, coupled to the loop filter, to generate delta sigma modulator quantizer output samples; and
an output modifier, coupled to the quantizer, to generate a modification signal and modify the quantizer output samples with the modification signal to generate modified quantizer output samples; and
a pulse width modulator, coupled to the delta sigma modulator, to modulate the quantizer output samples and to generate pulses in a pulse width modulator output signal, wherein each pulse has a pulse start time and a pulse end time relative to a beginning of a respective frame of the pulse width modulator output signal and the modification signal causes pulse start times and pulse end times of the pulses to differ sufficiently from pulse start times and pulse end times of unmodified quantizer output samples to reduce energy levels of at least the $3^{rd}$ and $5^{th}$ harmonic frequencies of the pulse width modulator output signal by at least 3 dB relative to energy levels of the $3^{rd}$ and $5^{th}$ harmonic frequencies of a pulse width modulated output signal generated with unmodified quantizer output samples.

30. The signal processing system of claim 29 wherein:
the output modifier is configured to generate the modification signal and modify the loop filter output samples with the modification signal to generate modified loop filter output samples; and
the quantizer is configured to quantize the modified loop filter output samples to generate delta sigma modulator quantizer output samples.

31. The signal processing system of claim 29 wherein the modification signal causes frame-to-frame duty cycles of the pulses to change.

32. The signal processing system of claim 29 wherein duty cycles of the frames corresponding to the modified loop filter output samples vary from frame-to-frame.

33. The signal processing system of claim 29 wherein the loop filter output modifier further comprises:
a loop filter modification signal source to generate a pre-modification output signal;
a low pass filter, coupled to the loop filter modification signal source, to low pass filter the pre-modification signal; and
a modulator, coupled to the low pass filter, to modulate the pre-modification signal up to a modulation frequency to generate the modification signal.

34. The signal processing system of claim 33 wherein the modification output signal is a random noise signal.

35. The signal processing system of claim 33 wherein the pre-modification signal is modulated up to one-half of an operating frequency of the delta sigma modulator.

36. The signal processing system of claim 33 wherein the low pass filter has a cut-off frequency in the range of 1 kHz to 3 kHz.

37. The signal processing system of claim 29 wherein each frame has a period equal to time T, and the pulse start times of pulses in sequential frames differ by at least T/3 for low-level input signals.

38. The signal processing system of claim 29 further comprising a correction factors generator, coupled between the quantizer and the loop filter to generate correction factors to correct for non-linearities in the pulse width modulator output signal and to provide the correction factors to at least one integrator of a delta sigma modulator loop filter that generates the delta sigma modulator loop filter output samples.

39. The signal processing system of claim 29 further comprising a modulator to multiply each loop filter output sample by a sample of the modification signal.

40. The signal processing system of claim 29 wherein the delta sigma modulator is further configured to process N channels and spread a spectrum of harmonic frequencies in pulse width modulator output signals for the N channels, wherein N is an integer greater than one.

41. The signal processing system of claim 29 wherein the set of delta sigma modulator input samples represents one channel of N channels, and N is an integer greater than one, the signal processing system further comprising:
N−1 additional inputs to receive N−1 additional sets of delta sigma modulator input samples, wherein each of the N sets of multiple delta sigma modulator input samples represents delta sigma modulator input data samples associated with one of the N channels;
N−1 additional loop filters, coupled to the N−1 additional inputs, to generate respective delta sigma modulator loop filter output samples for respective channels in response to receiving the delta sigma modulator input samples;
N−1 additional loop filter output modifiers, coupled to the N−1 additional loop filters, to respectively generate respective modification signals for respective channels to modify the loop filter output samples of respective channels with the modification signal and generate modified loop filter output samples for each of the N channels;
N−1 additional quantizers, coupled to the N−1 additional loop filter output modifiers, to respectively quantize the modified loop filter output samples for respective channels and generate respective delta sigma modulator quantizer output samples for each of the N channels; and
N−1 pulse width modulators, coupled to the N−1 additional quantizers, to respectively modulate the quantizer output samples to generate pulses in pulse width modulator output signals for each of the N channels, wherein, for each pulse width modulator output signal, each pulse has a pulse start time and a pulse end time relative to a beginning of a respective frame of the pulse width modulator output signal and the modification signal causes the pulse start times and pulse end times of the pulses to differ sufficiently from pulse start times and pulse end times of unmodified quantizer output samples to reduce collective energy levels for all N channels for at least the $3^{rd}$ and $5^{th}$ harmonic frequencies of the pulse width modulator output signals by at least 3 dB relative to energy levels of the $3^{rd}$ and $5^{th}$ harmonic frequencies of collective pulse width modulated output signals generated with unmodified loop filter output samples.

42. The signal processing system of claim 29 wherein the set of delta sigma modulator input samples represents one channel of N channels, and N is an integer greater than one, the signal processing system further comprising:
N−1 additional inputs to receive N−1 additional sets of delta sigma modulator input samples, wherein each of the N sets of multiple delta sigma modulator input samples represents delta sigma modulator input data samples associated with one of the N channels;

N−1 additional loop filters, coupled to the N−1 additional inputs, to generate delta sigma modulator loop filter output samples in response to receiving the delta sigma modulator input samples;

N additional loop filter output modifiers, coupled to the loop filter output modifier, to modify the loop filter output samples with the modification signal and with second modification signals $S_i$ to generate modified loop filter output samples for each of the N channels, wherein $i\epsilon\{1, 2, \ldots, N\}$ and $S_x \neq S_y$ for $x\epsilon\{1, 2, \ldots, N\}$ and $y\epsilon\{1, 2, \ldots, N\}$;

N−1 additional quantizers, coupled to the N additional loop filter output modifiers, to quantize the modified loop filter output samples of each of the N channels to generate delta sigma modulator quantizer output samples for each of the N channels; and N−1 pulse width modulators, coupled to the N−1 additional quantizers, to modulate the quantizer output samples to generate pulses in pulse width modulator output signals for each of the N channels, wherein, for each pulse width modulator output signal, each pulse has a pulse start time and a pulse end time relative to a beginning of a respective frame of the pulse width modulator output signal and the modification signals and second modification signals cause the pulse start times and pulse end times of the pulses to differ sufficiently from pulse start times and pulse end times of unmodified quantizer output samples to reduce collective energy levels for all N channels for at least the $3^{rd}$ and $5^{th}$ harmonic frequencies of the pulse width modulator output signals by at least 3 dB relative to energy levels of the $3^{rd}$ and $5^{th}$ harmonic frequencies of collective pulse width modulated output signals generated with unmodified loop filter output samples.

43. The signal processing system of claim 29 wherein the set of delta sigma modulator input samples represents one channel of N channels, and N is an integer greater than one, the signal processing system further comprising:

N−1 additional inputs to receive N−1 additional sets of delta sigma modulator input samples, wherein each of the N sets of multiple delta sigma modulator input samples represents delta sigma modulator input data samples associated with one of the N channels;

N−1 additional loop filters, coupled to the N−1 additional inputs, to generate delta sigma modulator loop filter output samples in response to receiving the delta sigma modulator input samples;

N−1 additional loop filters, coupled to the N−1 additional inputs, to generate modified loop filter output samples for each of the N channels;

N−1 additional quantizers, coupled to the N−1 additional loop filter output modifiers, to respectively quantize the modified loop filter output samples for respective channels to generate delta sigma modulator quantizer output samples for each of the N channels;

N−1 pulse width modulators, coupled to the N−1 additional quantizers, to respectively modulate the quantizer output samples to generate pulses for pulse width modulator output signals for each of the N channels, wherein, for each pulse width modulator output signal, each pulse has a pulse start time and a pulse end time relative to a beginning of a respective frame of the pulse width modulator output signal; and N channel interlockers, coupled to the N−1 pulse width modulators, wherein each channel interlocker is configured to modify the pulse start times and pulse end times for one channel in response to previously determined pulse start times and pulse end times of another channel if the pulse start times and pulse end times occur concurrently, wherein the modification signals and subsequent modification of the pulse start times and pulse end times causes the pulse start times and pulse end times of the pulses to differ sufficiently from pulse start times and pulse end times of unmodified quantizer output samples to reduce collective energy levels for all N channels for at least the $3^{rd}$ and $5^{th}$ harmonic frequencies of the pulse width modulator output signals by at least 3 dB relative to energy levels of the $3^{rd}$ and $5^{th}$ harmonic frequencies of collective pulse width modulated output signals generated with unmodified loop filter output samples.

44. A signal processing system comprising:
a delta sigma modulator having:
an input to receive a set of delta sigma modulator input samples;
a loop filter, coupled to the input, to generate delta sigma modulator loop filter output samples in response to receiving the delta sigma modulator input samples;
a modification signal source to generate a pre-modification output signal;
a low pass filter, coupled to the modification signal source, to low pass filter the pre-modification signal;
a modulator, coupled to the low pass filter, to modulate the pre-modification signal up to a modulation frequency to generate a modification signal;
a quantizer, coupled to the loop filter, to generate delta sigma modulator quantizer output samples;
a modification component, coupled to the quantizer, to modify the quantizer output samples with the modification signal to generate modified quantizer output samples; and
a pulse width modulator, coupled to the delta sigma modulator, to modulate the modified quantizer output samples to generate pulses in a pulse width modulator output signal.

45. The signal processing system of claim 44 wherein:
the modification component is configured to modify the loop filter output samples with the modification signal to generate modified loop filter output samples; and
the quantizer is configured to quantize the modified loop filter output samples to generate delta sigma modulator quantizer output samples.

46. The signal processing system of claim 44 wherein each pulse has a pulse start time and a pulse end time relative to a beginning of a respective frame of the pulse width modulator output signal and the modification signal causes pulse start times and pulse end times of the pulses to differ sufficiently from pulse start times and pulse end times of unmodified quantizer output samples to reduce energy levels of at least the $3^{rd}$ and $5^{th}$ harmonic frequencies of the pulse width modulator output signal by at least 3 dB relative to energy levels of the $3^{rd}$ and $5^{th}$ harmonic frequencies of a pulse width modulated output signal generated with unmodified quantizer output samples.

47. The signal processing system of claim 46 wherein each frame has a period equal to time T, and the pulse start times of pulses in sequential frames differ by at least T/3 for low-level input signals.

48. The signal processing system of claim 44 wherein the pre-modification output signal is a random signal.

49. The signal processing system of claim 44 wherein the pre-modification signal is modulated up to one-half of an operating frequency of the delta sigma modulator.

50. The signal processing system of claim 44 wherein the low pass filter has a cut-off frequency in the range of 1 kHz to 3 kHz.

51. The signal processing system of claim 44 further comprising a correction factors generator, coupled between the quantizer and the loop filter to generate correction factors to correct for non-linearities in the pulse width modulator output signal and to provide the correction factors to at least one integrator of a delta sigma modulator loop filter that generates the delta sigma modulator loop filter output samples.

52. The signal processing system of claim 44 further comprising a modulator to multiply each loop filter output sample by a sample of the modification signal.

53. The signal processing system of claim 44 wherein the delta sigma modulator is further configured to process N channels and spread a spectrum of harmonic frequencies in pulse width modulator output signals for the N channels, wherein N is an integer greater than one.

54. The signal processing system of claim 44 wherein spreading a spectrum of harmonic frequencies in pulse width modulator output signals for N channels comprises:
- N−1 additional inputs to receive N−1 additional sets of delta sigma modulator input samples, wherein each of the N sets of multiple delta sigma modulator input samples represents delta sigma modulator input data samples associated with one of the N channels;
- N−1 additional loop filters, coupled to the N−1 additional inputs, to generate respective delta sigma modulator loop filter output samples for respective channels in response to receiving the delta sigma modulator input samples associated with the channel;
- N−1 additional modification components, coupled to the N−1 additional loop filters, to modify the loop filter output samples of each of the N channels with the modification signal to generate modified loop filter output samples for each of the N channels;
- N−1 additional quantizers, coupled to the N−1 additional modification components to quantize the modified loop filter output samples of each of the N channels to generate delta sigma modulator quantizer output samples for each of the N channels; and
- N−1 pulse width modulators, coupled to the N−1 additional quantizers, to respectively modulate the quantizer output samples to generate pulses in pulse width modulator output signals for each of the N channels, wherein, for each pulse width modulator output signal, each pulse has a pulse start time and a pulse end time relative to a beginning of a respective frame of the pulse width modulator output signal and the modification signal causes the pulse start times and pulse end times of the pulses to differ sufficiently from pulse start times and pulse end times of unmodified quantizer output samples to reduce collective energy levels for all N channels for at least the $3^{rd}$ and $5^{th}$ harmonic frequencies of the pulse width modulator output signals by at least 3 dB relative to energy levels of the $3^{rd}$ and $5^{th}$ harmonic frequencies of collective pulse width modulated output signals generated with unmodified loop filter output samples.

55. The signal processing system of claim 44 wherein the set of delta sigma modulator input samples represents one channel of N channels, and N is an integer greater than one, the signal processing system further comprising:
- N−1 additional inputs to receive N−1 additional sets of delta sigma modulator input samples, wherein each of the N sets of multiple delta sigma modulator input samples represents delta sigma modulator input data samples associated with one of the N channels;
- N−1 additional loop filters, coupled to the N−1 additional inputs, to generate delta sigma modulator loop filter output samples in response to receiving the delta sigma modulator input samples associated with the channel;
- N additional loop filter output modifiers, coupled to the loop filter output modifier, to modify the loop filter output samples with the modification signal and with a second modification signals Si to generate modified loop filter output samples for each of the N channels, wherein i∈{1, 2, . . . , N} and $S_x \ne S_y$ for x∈{1, 2, . . . , N} and y∈{1, 2, . . . , N};
- N−1 additional quantizers, coupled to the N additional loop filter output modifiers, to quantize the modified loop filter output samples of each of the N channels to generate delta sigma modulator quantizer output samples for each of the N channels; and
- N−1 pulse width modulators, coupled to the N−1 additional quantizers, to modulate the quantizer output samples to generate pulses in pulse width modulator output signals for each of the N channels, wherein, for each pulse width modulator output signal, each pulse has a pulse start time and a pulse end time relative to a beginning of a respective frame of the pulse width modulator output signal and the modification signal causes the pulse start times and pulse end times of the pulses to differ sufficiently from pulse start times and pulse end times of unmodified quantizer output samples to reduce collective energy levels for all N channels for at least the $3^{rd}$ and $5^{th}$ harmonic frequencies of the pulse width modulator output signals by at least 3 dB relative to energy levels of the $3^{rd}$ and $5^{th}$ harmonic frequencies of collective pulse width modulated output signals generated with unmodified loop filter output samples.

56. The signal processing system of claim 44 wherein the set of delta sigma modulator input samples represents one channel of N channels, and N is an integer greater than one, the signal processing system further comprising:
- N−1 additional inputs to receive N−1 additional sets of delta sigma modulator input samples, wherein each of the N sets of multiple delta sigma modulator input samples represents delta sigma modulator input data samples associated with one of the N channels;
- N−1 additional loop filters, coupled to the N−1 additional inputs, to generate delta sigma modulator loop filter output samples in response to receiving the delta sigma modulator input samples associated with the channel;
- N−1 additional modification components, coupled to the n−1 additional loop filters, to modify the loop filter output samples of each of the N channels with the modification signal to generate modified loop filter output samples for each of the N channels;
- N−1 additional quantizers, coupled to the N−1 additional modification components to quantize the modified loop filter output samples of each of the N channels to generate delta sigma modulator quantizer output samples for each of the N channels;
- N−1 pulse width modulators, coupled to the N−1 additional quantizers, to respectively modulate the quantizer output samples to generate pulses for pulse width modulator output signals for each of the N channels, wherein, for each pulse width modulator output signal, each pulse has a pulse start time and a pulse end time relative to a beginning of a respective frame of the pulse width modulator output signal;

N channel interlockers, coupled to the N−1 pulse width modulators, wherein each channel interlocker is configured to modify the pulse start times and pulse end times for one channel in response to previously determined pulse start times and pulse end times of another channel if the pulse start times and pulse end times occur concurrently, wherein the modification signal and subsequent modification of the pulse start times and pulse end times causes the pulse start times and pulse end times of the pulses to differ sufficiently from pulse start times and pulse end times of unmodified quantizer output samples to reduce collective energy levels for all N channels for at least the $3^{rd}$ and $5^{th}$ harmonic frequencies of the pulse width modulator output signals by at least 3 dB relative to energy levels of the $3^{rd}$ and $5^{th}$ harmonic frequencies of collective pulse width modulated output signals generated with unmodified loop filter output samples.

* * * * *